US012529685B2

(12) United States Patent
Loux et al.

(10) Patent No.: US 12,529,685 B2
(45) Date of Patent: *Jan. 20, 2026

(54) FILTER ASSEMBLIES, DEPTH INDICATORS, TORQUE-LIMITING FITTINGS, TORQUE-INDICATING FITTINGS, AND SYSTEMS INCORPORATING THE SAME

(71) Applicant: AGILENT TECHNOLOGIES, INC., Santa Clara, CA (US)

(72) Inventors: Alan D. Loux, Santa Clara, CA (US); Lucas Serge, Santa Clara, CA (US); Manuel Van Venrooy, Santa Clara, CA (US); Thomas Harrison, Santa Clara, CA (US); Matthias Kamuf, Santa Clara, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 200 days.

This patent is subject to a terminal disclaimer.

(21) Appl. No.: 17/641,405

(22) PCT Filed: Jun. 29, 2021

(86) PCT No.: PCT/US2021/039647
§ 371 (c)(1),
(2) Date: Mar. 8, 2022

(87) PCT Pub. No.: WO2022/006130
PCT Pub. Date: Jan. 6, 2022

(65) Prior Publication Data
US 2023/0110390 A1  Apr. 13, 2023

Related U.S. Application Data
(60) Provisional application No. 63/047,469, filed on Jul. 2, 2020.

(51) Int. Cl.
*G01N 30/60* (2006.01)
*B01D 15/12* (2006.01)
(Continued)

(52) U.S. Cl.
CPC ......... *G01N 30/603* (2013.01); *B01D 15/125* (2013.01); *B01D 15/22* (2013.01);
(Continued)

(58) Field of Classification Search
CPC ............. G01N 30/603; G01N 30/6026; B01D 15/125; B01D 15/22; B01D 15/26;
(Continued)

(56) References Cited

U.S. PATENT DOCUMENTS 4,283,280 A   8/1981  Brownlee
5,545,242 A   8/1996  Whitlock et al.
(Continued)

FOREIGN PATENT DOCUMENTS

CN   108166849 A   6/2018
CN   109789429 A   5/2019
(Continued)

OTHER PUBLICATIONS

German Patent and Trademark Office, "English translation of Search Report for Application No. DE112021000095.0", Dated Aug. 9, 2023, 8 pages.
(Continued)

*Primary Examiner* — Terry K Cecil

(57) ABSTRACT

In some examples, a filter assembly may include a filter including a first gasket having a first channel adjacent to a first side of the filter and a second gasket having a second channel adjacent to a second side of the filter. The first gasket and the second gasket may include a beveled surface adjacent to the filter. The first channel and the second
(Continued)

channel may include a diameter of from about 0.01 mm to about 0.5 mm. A finger tightening system may securely hold the filter without any leaks.

14 Claims, 19 Drawing Sheets

(51) Int. Cl.
*B01D 15/22* (2006.01)
*B01D 15/26* (2006.01)
*B01D 29/58* (2006.01)
*B01D 35/30* (2006.01)

(52) U.S. Cl.
CPC ............. *B01D 15/26* (2013.01); *B01D 29/58* (2013.01); *B01D 35/30* (2013.01); *G01N 30/6026* (2013.01); *B01D 2201/24* (2013.01); *B01D 2201/29* (2013.01); *B01D 2201/342* (2013.01); *B01D 2201/345* (2013.01); *B01D 2201/4046* (2013.01); *B01D 2201/4092* (2013.01)

(58) Field of Classification Search
CPC .... B01D 29/58; B01D 35/30; B01D 2201/24; B01D 2201/29; B01D 2201/342; B01D 2201/345; B01D 2201/4046; B01D 2201/4092; B01D 2201/34
USPC ....................................................... 210/450
See application file for complete search history.

(56) References Cited

U.S. PATENT DOCUMENTS

| | | |
|---|---|---|
| 6,361,687 B1 | 3/2002 | Ford et al. |
| 8,936,723 B2 | 1/2015 | Nickerson et al. |
| 11,389,747 B2 | 7/2022 | Delano |
| 2010/0224543 A1 | 9/2010 | Ellis et al. |
| 2012/0239095 A1 | 9/2012 | Barrall |
| 2016/0097474 A1 | 4/2016 | Settu et al. |
| 2017/0051860 A1 | 2/2017 | Beemer et al. |
| 2019/0030457 A1 | 1/2019 | DeLine |
| 2023/0110390 A1 | 4/2023 | Loux et al. |

FOREIGN PATENT DOCUMENTS

| | | |
|---|---|---|
| EP | 0448217 A2 | 9/1991 |
| EP | 2597460 | 5/2013 |
| JP | H0647857 U | 6/1994 |
| KR | 101638041 B1 | 7/2016 |
| SU | 842574 A1 | 6/1981 |
| WO | 2014197783 A1 | 12/2014 |

OTHER PUBLICATIONS

US Office Action, U.S. Appl. No. 17/691,007, mailed Aug. 20, 2024. 27 pages.
International Search Report and Written Opinion for PCT Patent Application No. PCT/US2021/039647, filed Jun. 29, 2021, mailed on Oct. 21, 2021, Korean Intellectual Property Office, 14 pages.
International Search Report and Written Opinion—KIPO—International Application No. PCT/US2024/051432—mailed Jan. 24, 2025—9 pages.
US Office Action, U.S. Appl. No. 17/691,007, mailed Feb. 4, 2025, 27 pages.
US Office Action, U.S. Appl. No. 17/690,980, mailed Nov. 12, 2024, 17 pages.
US Office Action, U.S. Appl. No. 17/691,007, mailed Jun. 13, 2025, 15 pages.
US Office Action, U.S. Appl. No. 17/690,980, mailed May 28, 2025, 13 pages.
Chinese Search Report—Application No. 2021800052625—Chinese Patent Office—May 25, 2025—2 pages.
Chinese Office Action—Application No. 2021800052625—Chinese Patent Office—May 25, 2025—10 page.
Chinese Office Action and Search Report—Application No. 2021800052625—Chinese Patent Office—May 25, 2025—18 pages.
U.S. Office Action—U.S. Appl. No. 17/690,980—mailed Aug. 26, 2025—9 pages.
Notice of Allowance—U.S. Appl. No. 17/691,007—mailed Nov. 18, 2025—19 pages.

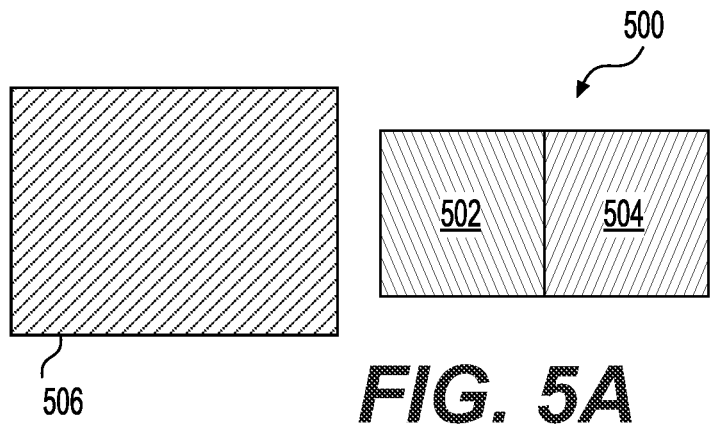
FIG. 5A
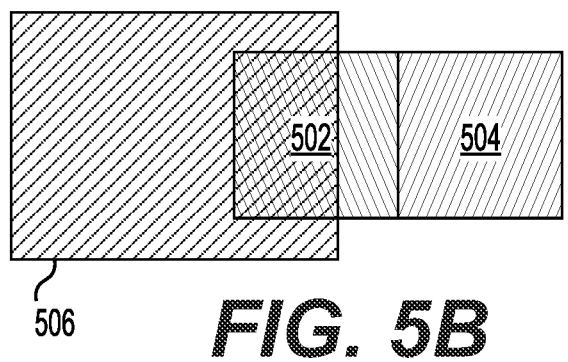
FIG. 5B
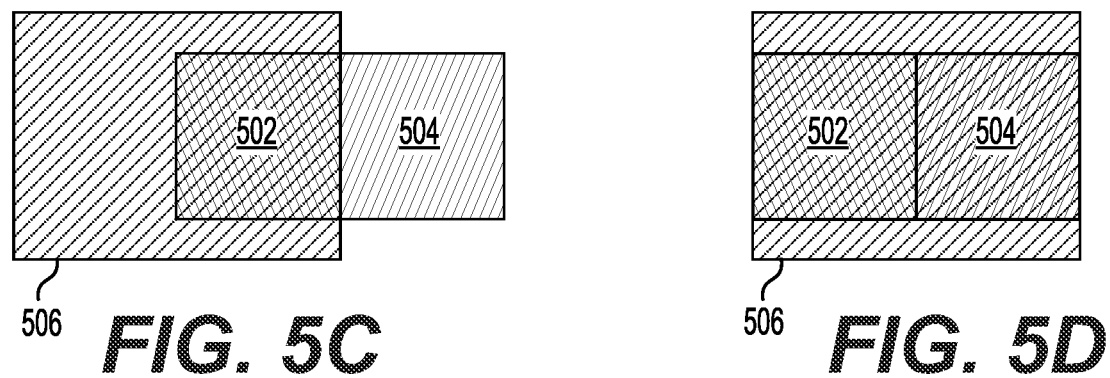
FIG. 5C  FIG. 5D

FILTER ASSEMBLIES, DEPTH INDICATORS, TORQUE-LIMITING FITTINGS, TORQUE-INDICATING FITTINGS, AND SYSTEMS INCORPORATING THE SAME

CROSS-REFERENCE TO RELATED APPLICATION(S)

This application is a national stage filing under 35 U.S.C 371 of PCT application number PCT/US2021/039647, having an international filing date of Jun. 29, 2021, which claims priority to U.S. Provisional Patent Application Ser. No. 63/047,469, filed Jul. 2, 2020, titled "FILTER ASSEMBLIES, DEPTH INDICATORS, TORQUE-LIMITING FITTINGS, AND SYSTEMS INCORPORATING THE SAME", the disclosures of which are hereby incorporated by reference in their entireties.

BACKGROUND

High-performance liquid chromatography (HPLC) may use operational pressures in excess of 50 bar (5,000 kPa). HPLC systems may include a number of components including filters that need to be fluid-tight, replaceable, and reconfigurable. These filters may include sintered stainless steel or plastic disks that are retained in a housing. These filters may additionally be encapsulated in a plastic or metal ring which aids in sealing the filters at high pressures, and are considered "open" filters because of the direct access of pressurized fluid to a filter face.

BRIEF DESCRIPTION OF DRAWINGS

Features of the present disclosure are illustrated by way of example and not limited in the following figure(s), in which like numerals indicate like elements, in which:

FIGS. 5A-5D depict a two-color depth indicator, in accordance with an example of the present disclosure;

DETAILED DESCRIPTION

Figure 1:
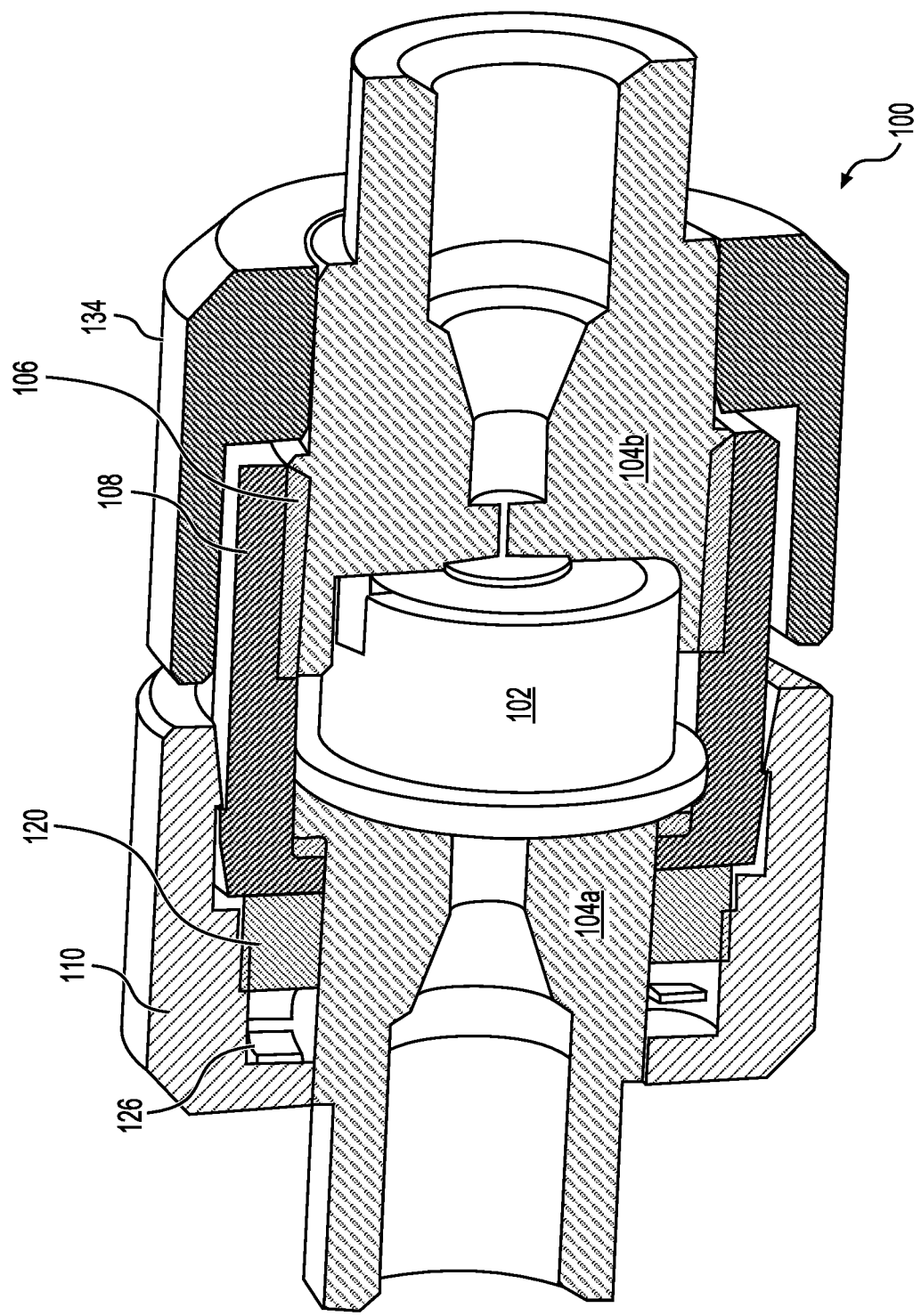
FIG. 1 is a perspective partial cross-section of a system including a torque-limiting fitting and a filter assembly, in accordance with an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, and the term "including" means including but not limited to. The term "based on" means based at least in part on.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term about.

Unless specifically stated or obvious from context, the term "or," as used herein, is understood to be inclusive.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 (as well as fractions thereof unless the context clearly dictates otherwise).

Examples described herein relate to systems capable of fluid-tight couplings without the need for tools such as wrenches, screwdrivers, and the like.

According to examples disclosed herein, a filter assembly may include a filter, a first gasket adjacent to a first side of the filter, a second gasket adjacent to a second side of the filter, a female housing, and a male housing. The male housing may be sized to fit concentrically within the female housing. Each of the male housing and female housing may include a bore, and a stop shoulder surrounding the bore. Each of the first gasket and second gasket may include a complementary geometry to form a seal against a respective stop shoulder.

For the filter assembly described above, the bores may define a central axis. In this regard, the stop shoulders may be perpendicular to the central axis. The filter, the first gasket, the second gasket, the female housing, and the male housing may be radially symmetric about the central axis.

For the filter assembly described above, the first gasket and the second gasket each may include a central axial bore.

For the filter assembly described above, the first gasket and the second gasket may include a beveled surface adjacent to the filter. The beveled surface may include an angle relative to a central axis of from about 70 degrees to about 89 degrees.

For the filter assembly described above, fluid flow pressure about the filter may produce increased sealing pressure between the complementary geometry of the first and second gaskets and respective stop shoulder of the female and male housings relative to a pre-flow state.

For the filter assembly described above, the filter assembly may be fluid-tight at fluid-flow pressures of 1,300 bar (130,000 kPa) without requiring a pre-flow sealing pressure above 13 pounds-force (57.8 N).

For the filter assembly described above, the male housing and the female housing may be press-fit together or are threaded together.

For the filter assembly described above, the filter may include a first filter, a second filter, and a media between the first filter and the second filter.

According to examples disclosed herein, a filter assembly may include, a filter, a first gasket having a first channel adjacent to a first side of the filter, and a second gasket having a second channel adjacent to a second side of the filter. The first gasket and the second gasket may include a beveled surface adjacent to the filter. The first channel and the second channel may include a diameter of from about 0.01 mm to about 0.5 mm.

According to examples disclosed herein, a guard column assembly may include a first filter, a second filter, a media positioned between the first filter and the second filter, a first gasket having a first channel adjacent to the first filter, and a second gasket having a second channel adjacent to the second filter. The first gasket and the second gasket may include a beveled surface adjacent to the first filter and the second filter, respectively. The first channel and the second channel may include a diameter of from about 0.01 mm to about 0.5 mm.

According to examples disclosed herein, a system may include a female housing including internal helical threads, a male housing including external helical threads and defining an axial bore adapted and configured to receive a filter or a guard column assembly, and a two-color depth indicator positioned external to the male housing or the female housing. The two-color depth indicator may include a distal color, and a proximal color. The distal color and the proximal color may be positioned such that, when the female housing or the male housing are tightened over the counterpart male housing or the female housing, if the filter assembly is correctly inserted and the two-color depth indicator is positioned external to the male housing, then the female housing may cover the proximal color such that only the distal color is visible and if the filter assembly is correctly inserted and the two-color depth indicator is positioned external to female housing, then a cover may hide the proximal color such that only the distal color is visible. If the filter assembly is incorrectly inserted or is defective, both the proximal color and the distal color may be visible. If no filter assembly is inserted, the female housing or the cover may hide both the proximal color and the distal color such that neither the proximal color nor the distal color are visible.

For the system described above, the two-color depth indicator may be formed through at least one process including printing, painting, electroplating, brush electroplating, or anodizing.

For the system described above, the two-color depth indicator may be a ring placed over the external helical threads of the male housing. The ring may be threaded over the external helical threads of the male housing.

For the system described above, the two-color depth indicator may include an adhesive tape, a sticker, and a rubber band.

For the system described above, the female housing may further include a distal, unthreaded portion adjacent to the internal helical threads. The distal, unthreaded portion may include an axial length equal to or exceeding an axial length of the two-color depth indicator.

For the system described above, the distal color may be green, and the proximal color may be red.

According to examples disclosed herein, a torque-limiting fitting may include a driven coupler including a sealing region, and at least one driven tooth including, in a sealing direction of the driven coupler, a sloped rotationally trailing surface. A driving collar may include at least one driving tooth positioned to engage with the at least one driven tooth as the driving collar is rotated.

For the torque-limiting fitting described above, the torque-limiting fitting may further include a resilient member adjacent to the driving collar.

For the torque-limiting fitting described above, a thumbpiece may cover at least the driving collar and the resilient member. The thumbpiece may include a recess accommodating the driving collar and the resilient member, and at least one advancement-limiting feature adapted and configured to limit axial movement of the thumbpiece.

For the torque-limiting fitting described above, the sealing region may include helical threads. The sealing region may be located on a distal end of the driven coupler.

For the torque-limiting fitting described above, the at least one driven tooth may be located on a proximal end or on a radially outer surface of the driven coupler.

For the torque-limiting fitting described above, the at least one driving tooth may include an asymmetric profile rotationally opposite to the at least one driven tooth.

For the torque-limiting fitting described above, the driving collar may further include at least one axial collar-alignment feature. The at least one axial collar-alignment feature may be located radially outer from or inner to the at least one driving tooth. The at least one advancement-limiting feature may include a stop shoulder.

For the torque-limiting fitting described above, the thumbpiece and the driven coupler may further include complementary features to hold the thumbpiece and the driven coupler together with the driving collar and the resilient member held between. The complementary feature may include a first radial undercut, and a second radial undercut and/or at least one boss.

For the torque-limiting fitting described above, the driven coupler and the driving collar may be formed from metal.

For the torque-limiting fitting described above, the resilient member may include a wave spring.

For the torque-limiting fitting described above, the thumbpiece may include a knurled outer surface. The thumbpiece may further include at least one axial thumbpiece-alignment feature complementary to at least one axial collar-alignment feature.

According to examples disclosed herein, a filter assembly may include a driven coupler engageable with a filter fitting of a filter cartridge. The driven coupler may include a bore to receive the filter fitting, and a stop shoulder surrounding the bore to limit movement of the driven coupler relative to the filter fitting.

For the filter assembly described above, the driven coupler may include an internal thread for threaded engagement with an external thread of the filter fitting.

For the filter assembly described above, the stop shoulder of filter fitting may be perpendicular to a central axis of the filter assembly.

For the filter assembly described above, the driven coupler, the filter fitting, and the filter cartridge may be radially symmetric about a central axis of the filter assembly.

For the filter assembly described above, the filter assembly may further include a thumbpiece engageable with the driven coupler to rotate the driven coupler.

According to examples disclosed herein, a filter cartridge may include a first filter fitting on one side of a filter, a second filter fitting on a second opposite side of the filter, a first gasket disposed in the first filter fitting, and a second gasket disposed in the second filter fitting.

For the filter cartridge described above, the first filter fitting and the second filter fitting may include external threads.

For the filter cartridge described above, the first gasket and second gasket may include a complementary geometry to respectively form a seal against a stop shoulder of the first filter fitting and a stop shoulder of the second filter fitting.

For the filter cartridge described above, the stop shoulder of the first filter fitting and the stop shoulder of the second filter fitting may be perpendicular to a central axis of the filter cartridge.

For the filter cartridge described above, the first filter fitting, the second filter fitting, the first gasket, and the second gasket may be radially symmetric about a central axis of the filter cartridge.

For the filter cartridge described above, the first gasket and the second gasket each may include a central axial bore.

For the filter cartridge described above, the first gasket and the second gasket may include a beveled surface adjacent to the filter. The beveled surface may include an angle relative to a central axis of the filter cartridge from about 70 degrees to about 89 degrees.

According to examples disclosed herein, a torque-indicating fitting may include a driven coupler including at least one driven tooth, and a torque-indicating driving collar including at least one driving tooth positioned to engage with the at least one driven tooth as the torque-indicating driving collar is rotated. The torque-indicating driving collar may further include at least one torque-indicating tooth positioned adjacent to the at least one driving tooth to engage with the at least one driven tooth as the torque-indicating driving collar is rotated.

The torque-indicating fitting may further include a resilient member adjacent to the torque-indicating driving collar, and a thumbpiece covering at least the torque-indicating driving collar and the resilient member. The thumbpiece may include a recess accommodating the torque-indicating driving collar and the resilient member, and at least one advancement-limiting feature adapted and configured to limit axial movement of the thumbpiece.

For the torque-indicating fitting described above, the at least one driven tooth may be located on a proximal end or on a radially outer surface of the driven coupler.

For the torque-indicating fitting described above, the torque-indicating driving collar may further include at least one axial collar-alignment feature. The at least one axial collar-alignment feature may be located radially outer from or inner to the at least one driving tooth.

For the torque-indicating fitting described above, the at least one advancement-limiting feature may include a stop shoulder.

For the torque-indicating fitting described above, the thumbpiece and the driven coupler may further include complementary features to hold the thumbpiece and the driven coupler together with the torque-indicating driving collar and the resilient member held between. The complementary features may include a thumbpiece protrusion and a driven coupler protrusion.

For the torque-indicating fitting described above, the driven coupler and the torque-indicating driving collar may be formed from metal.

For the torque-indicating fitting described above, the resilient member may be a wave spring.

For the torque-indicating fitting described above, the thumbpiece may include a knurled outer surface.

For the torque-indicating fitting described above, the thumbpiece may further include at least one axial thumbpiece-alignment feature complementary to at least one axial collar-alignment feature.

FIG. 1 provides a partial cross-section of a system 100 for coupling of a filter assembly 102 or a guard column 700b (FIG. 7B), for example, to a liquid chromatograph system. The system 100 may include fittings 104a and 104b, a driven coupler 108, a thumbpiece 110, a driving collar 120, a resilient member 126, such as a spring, and a cover 134. In an example, the driven coupler 108 may be rotatably positioned around the fitting 104a. The driving collar 120 may be positioned on top of the driven coupler 108, such that it may engage or disengage from the driven coupler 108 via the resilient member 126. The resilient member 126 may be positioned on top of or adjacent to the driving collar 120, such that when a torque applied by turning the thumbpiece 110 reaches a predetermined amount, the resilient member 126 allows the driving collar 120 to disengage from the driven coupler 108. Thus, in this example, the thumbpiece 110 is positioned and connected to the resilient member 126 and the driving collar 120. A user, by rotating the thumbpiece 110, may cause the driving collar 120 to engage and rotate the driven coupler 108 to removably connect the driven coupler 108 to the exterior surface of the fitting 104, thereby connecting the fitting 104a to the fitting 104b. Filter assembly 102 may be held between and fluidically coupled to fittings 104a and 104b, which may be coupled to other components of an LC system, e.g., by swaging and other techniques. Filter assembly 102 may be held between fittings 104a and 104b by a connection between the driven coupler 108, which may be in a form of a female housing, and the fitting 104b, which may be in a form of a male housing. In an example, a portion of the inner surface of the driven coupler 108 may include a sealing region, for example a set of helical threads 106, that correspond to a portion of the exterior surface of the fitting 104b that includes a second sealing region, for example, a set of second helical threads 106. By connecting the helical threads 106 of the driven coupler 108 and the fitting 104b, the fittings 104a and 104b may securely hold the filter assembly 102.

Torque-Limiting Fitting

Figure 2:
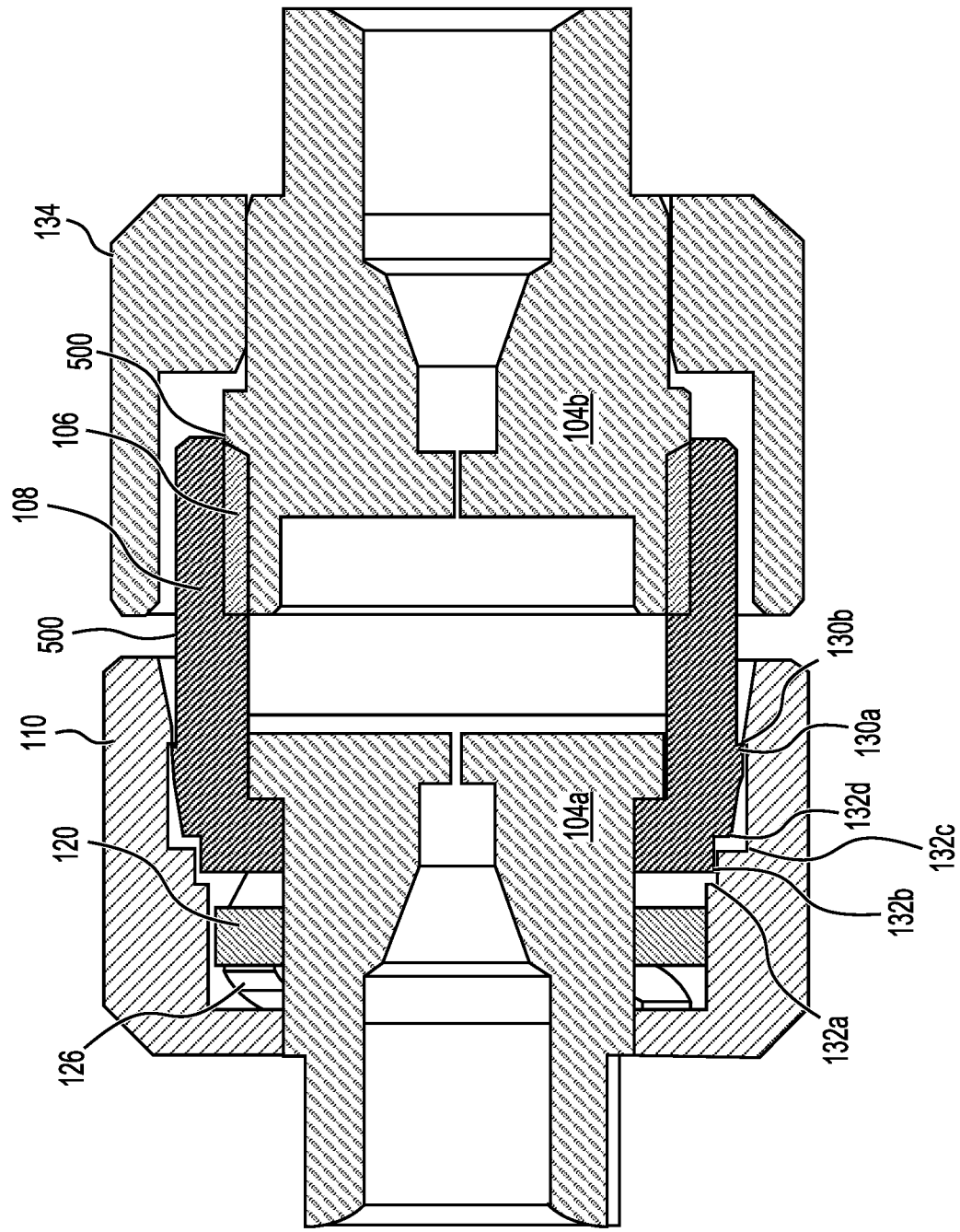
FIG. 2 is a side cross-section of a system including a torque-limiting fitting, in accordance with an example of the present disclosure.

Referring to FIG. 2, in an example, the system 100 may provide a torque-limiting fitting. The torque applied to the driven coupler 108 when a user rotates the thumbpiece 110 may be controlled, for example, to prevent damage to components and facilitate later removal. In an example, the force applied to the driven coupler 108 may be from about 1 Pounds-force (lbf) or less to about 32 lbf, for example, the force may be from about 2 lbf to about 24 lbf, from about 3 lbf to about 13 lbf, such as about 5 lbf.

Figure 3:
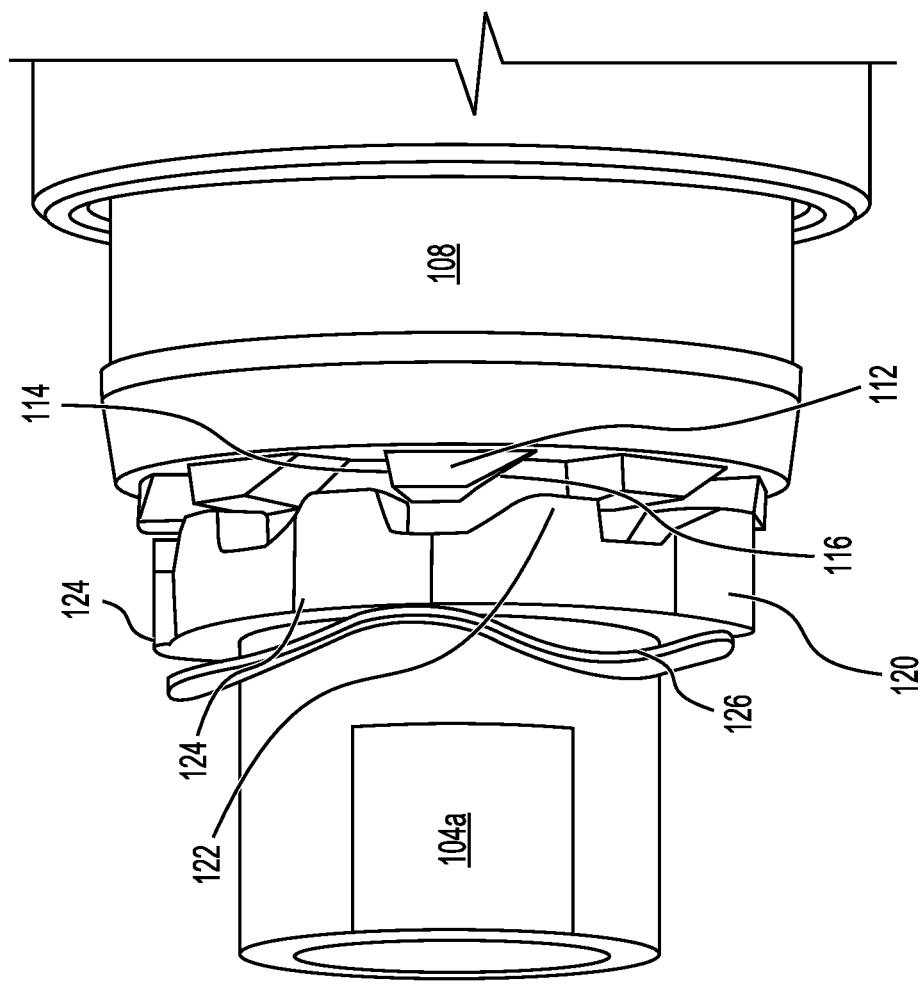
FIG. 3 is a side view of a system including a torque-limiting fitting, in accordance with an example of the present disclosure.

As best seen in FIG. 3, the driven coupler 108 may include one or more asymmetric driven teeth 112. The asymmetric driven teeth 112 may include a rotationally leading surface 114 and a rotationally trailing surface 116. When the driven coupler 108 is turned in a sealing direction (e.g., counterclockwise in the example depicted in FIG. 3), the rotationally trailing surface 116 has a lower slope than the rotationally leading surface 114. Examples of slopes for trailing surface 116 (relative to a radial plane) may include less than about 90°, such as about 45°, from about 45° to about 15°, from about 30° to about 15°, about 22.5°, and the like. Examples of slopes for surface 114 (relative to a radial plane) may include about 90° or less, such as from about 90° to about 75°, from about 85° to about 75°, and the like.

The driven coupler 108 may be driven by a driving collar 120 having one or more driving teeth 122 positioned to engage with the one or more asymmetric driven teeth 112 as the driving collar 120 is rotated via the force applied by the user to the thumbpiece 110 (shown in FIGS. 1 and 2). The driving teeth 122 may, but need not have an opposite, asymmetric profile relative to asymmetric driven teeth 112. In some examples, the slopes are identical, which may facilitate frictional engagement between driving teeth 122 and asymmetric driven teeth 112.

Figure 4:
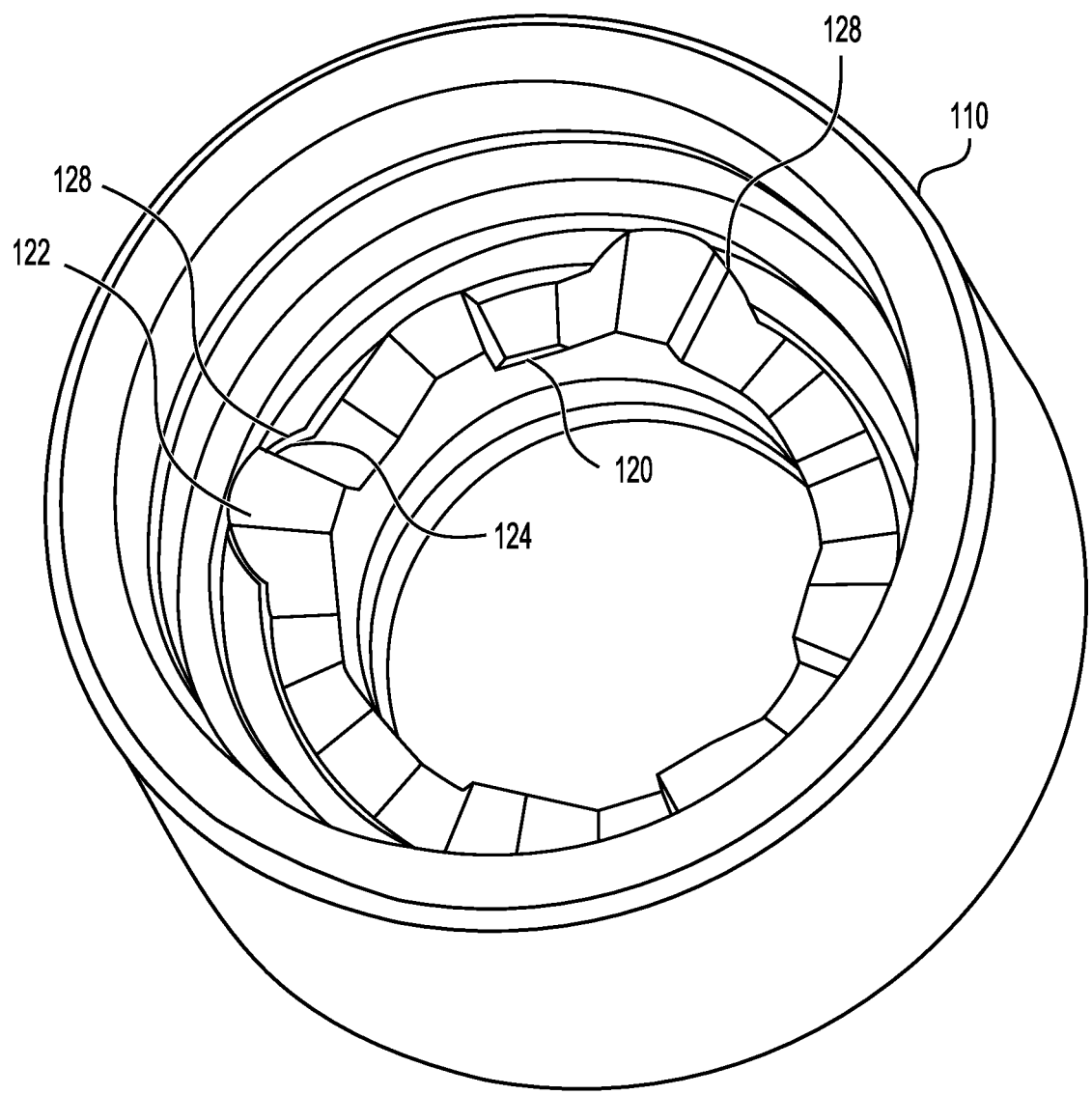
FIG. 4 is a distal perspective view of a driving collar seated within a thumbpiece, in accordance with an example of the present disclosure.

Referring to FIGS. 3 and 4, the driving collar 120 may include one or more axial collar-alignment features 124. Although axial collar-alignment features 124 depicted in FIGS. 3 and 4 are radially outer bosses or ridges, axial collar-alignment features 124 could be radially inner, grooves, and the like.

The resilient member 126 adjacent to the driving collar 120 may press the driving collar 120 against the driven coupler 108. Driving collar 120 may slide axially within axial thumbpiece-alignment features 128 complementary to the one or more axial collar-alignment features 124. The properties of the various components may be configured to allow the driving teeth 122 to frictionally engage with and drive asymmetric driven teeth 112 until a defined amount of torque is applied (e.g., a driven coupler 108 forms a threaded seal with the helical threads 106 located on the surface of the fitting 104b and resists further rotation). When the torque exceeds the configured threshold, the driving teeth 122 will slip and overcome the axial force applied by the resilient member 126. Thus, the driving collar 120 will slide proximally within the thumbpiece 110. The higher-sloped surface 114 will be more resistant to slipping and ensure easy removal even if the driven coupler 108 was tightened to the point of teeth slippage.

As best seen in FIGS. 1 and 2, the thumbpiece 110 may cover at least the driving collar 120 and resilient member 126, which may rest in a proximal recess in order to allow deformation of resilient member 126 and axial movement of driving collar 120. The thumbpiece 110 may be retained through one or more features such a radial undercuts 130a, 130b on driven coupler 108 and thumbpiece 110, respectively, that allow the thumbpiece 110 to rotate over the driven coupler 108 when the teeth 112, 122 slip during tightening.

Still referring to FIGS. 1 and 2, the thumbpiece 110 and/or the driven coupler 108 may include one or more advancement-limiting features 132a-132d, such as stop shoulders adapted and configured to limit or prevent axial movement of the thumbpiece 110. Such advancement-limiting features 132a-132d prevent a user from overcoming the torque-limiting features by pressing the thumbpiece 110 distally during rotation, which would further load the resilient member 126 and/or the driving collar 120 and reduce or prevent the ability of the driving teeth 122 to slip and the driving collar 120 to slide proximally.

The thumbpiece 110 may, but need not, be knurled, roughened, or include one or more features to aid in finger-tightening.

Visual Depth Indicator

Referring now to FIGS. 5A-5D, some examples of the system 100 may include a two-color depth indicator 500. The two-color depth indicator 500 may include two color regions 502 and 504 of different colors. The regions may be axially arranged such that the color region 502 is proximal and the color region 504 is distal relative to a radially outer component 506 (e.g., covering component).

Two-color depth indicator 500 may be positioned on an exterior surface so that the user may visualize the two-color depth indicator 500 and use it to assess whether a system is properly assembled. For example, referring to FIG. 2, two-color depth indicator 500 could be positioned on an exterior surface of driven coupler 108 and an exterior surface of fitting 104b (if cover 134 may slide distally so that the user may view fitting 104b), and the like. In another example, the driven coupler 108 may include two color regions 502 and 504. In this example, the color region 502 may be the exterior of the driven coupler 108 that corresponds to the threaded section in the interior surface of the driven coupler 108. Additionally, the color region 504 may correspond to the remaining exterior portion of the driven coupler 108. As a user screws the driven coupler 108 to the exterior surface of the fitting 104b, the cover 134 starts to cover exterior surface of the driven coupler 108 having the color region 502. When the driven coupler 108 is fully connected to the fitting 104b, the cover 134 may completely cover the color region 502; therefore, only the color region 504 may be visible to the user. The visibility of the single color region 504 is an indication that the driven coupler 108 is completely secured to the fitting 104b.

Two-color depth indicator 500 may be positioned along an exterior surface that is partially covered by another component 506 (e.g., driven coupler 108 in the case of fitting 104b, cover 134 in the case of driven coupler 108, and the like). The radially outer component 506 is depicted as partially transparent so that two-color depth indicator 500 may be visualized underneath. In some examples, the radially outer component 506 may be optically opaque.

Referring now to FIG. 5B, if a component is incorrectly assembled or is defective, both the proximal color region 502 and the distal color region 504 may be seen.

Referring now to FIG. 5C, if a component is correctly assembled, only the distal color region 504 may be seen.

Referring now to FIG. 5D, if a component (e.g., filter assembly 102) is missing, neither the proximal color region 502 nor the distal color region 504 may be seen.

Figure 6A:
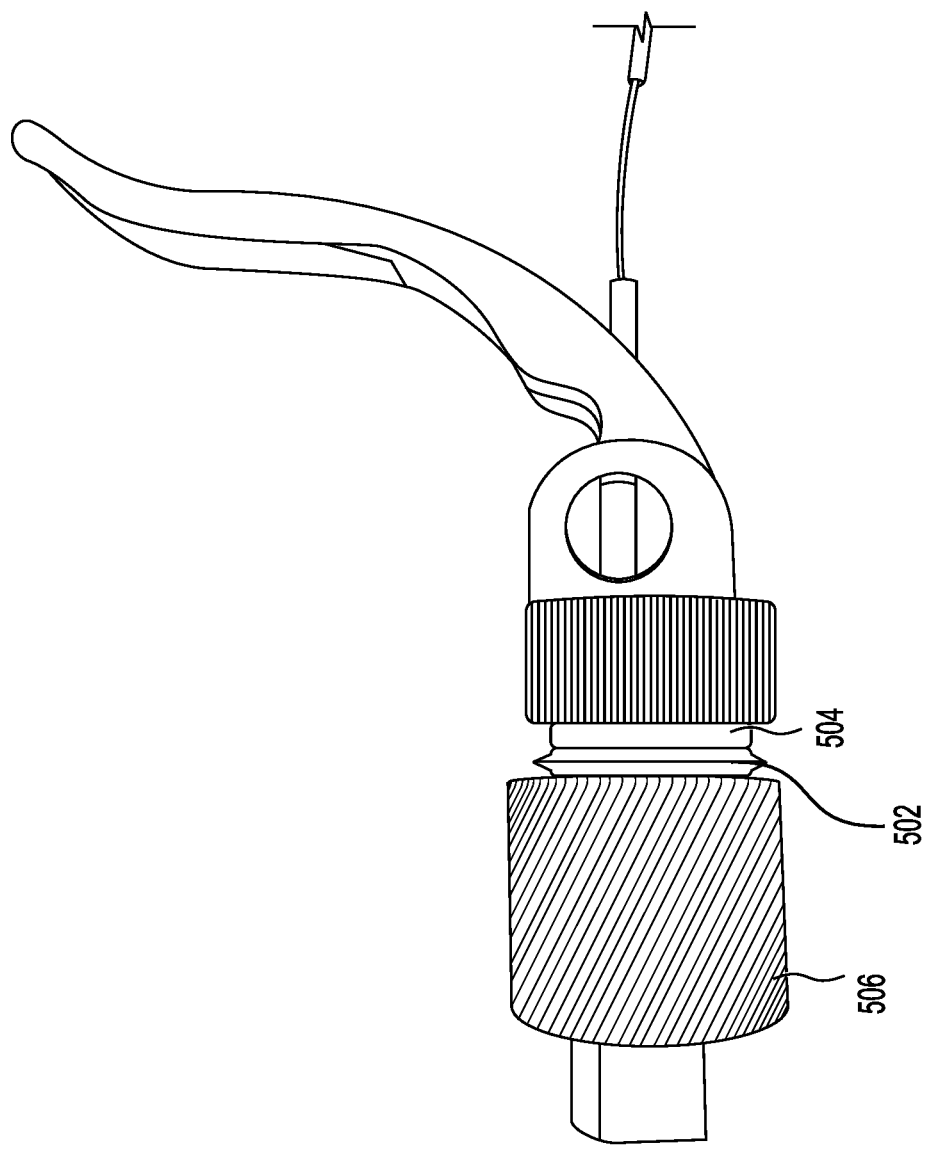
FIGS. 6A and 6B are illustrate a system including a two-color depth indicator, in accordance with an example of the present disclosure.
Figure 6B:
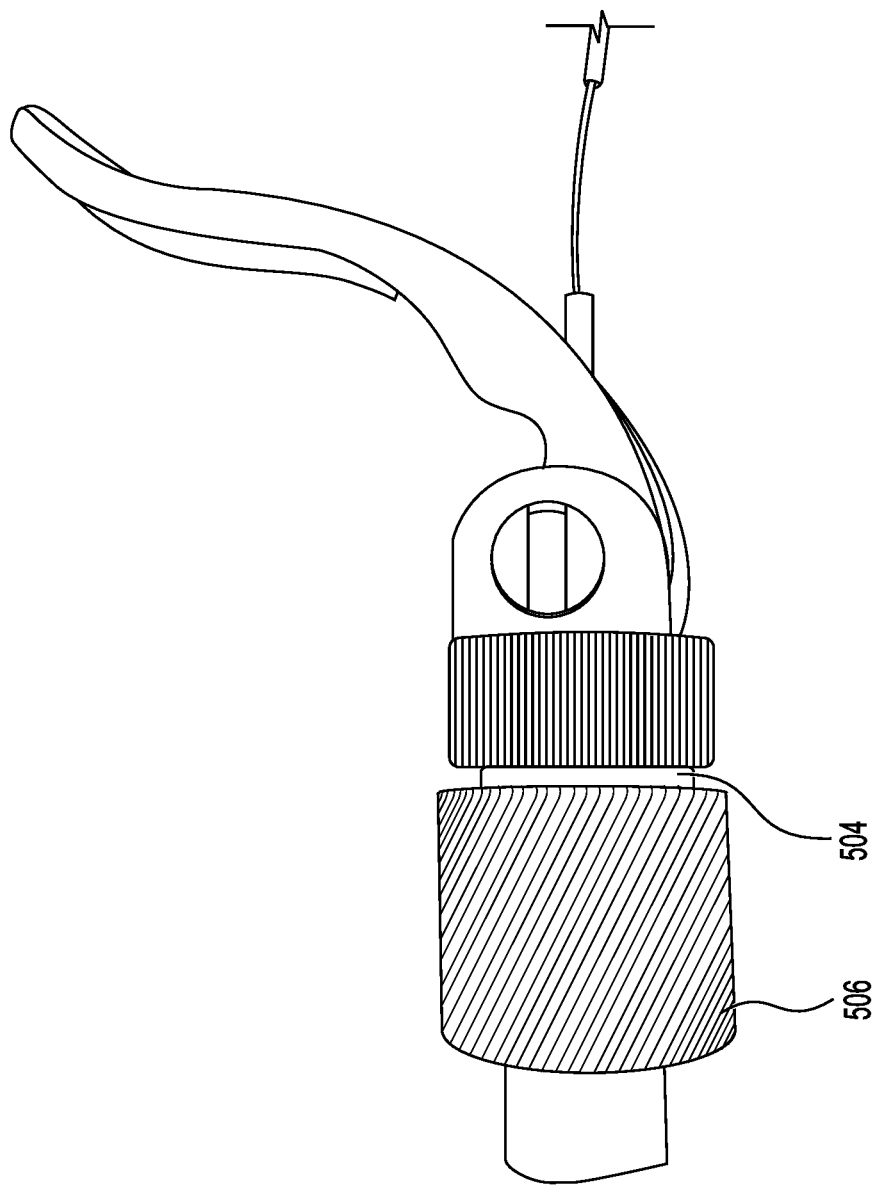

FIGS. 6A and 6B illustrate a system including a two-color depth indicator 500. The proximal color region 502 (red) and the distal color region 504 (green) may both be seen in FIG. 6A, indicating that the radially outer component 506 (e.g., thumbpiece) may need to be further tightened or that the filter assembly 102 is defective or improperly installed. In FIG. 6B, only the distal color 504 (green) may be seen, indicating that the radially outer component 506 (e.g., thumbpiece) is tightened properly.

The two-color depth indicator 500 may be annular or a strip. The two-color depth indicator 500 may be formed through various processes such as printing, painting, electroplating, brush electroplating, anodizing, and the like. The two-color depth indicator 500 may be an adhesive tape, a sticker, a rubber band, and the like. In one example, the two-color depth indicator 500 may be one or two colored rings that are installed (e.g., over external helical threads by threading, adhesive, or the like).

Filter Assembly

Figure 7A:
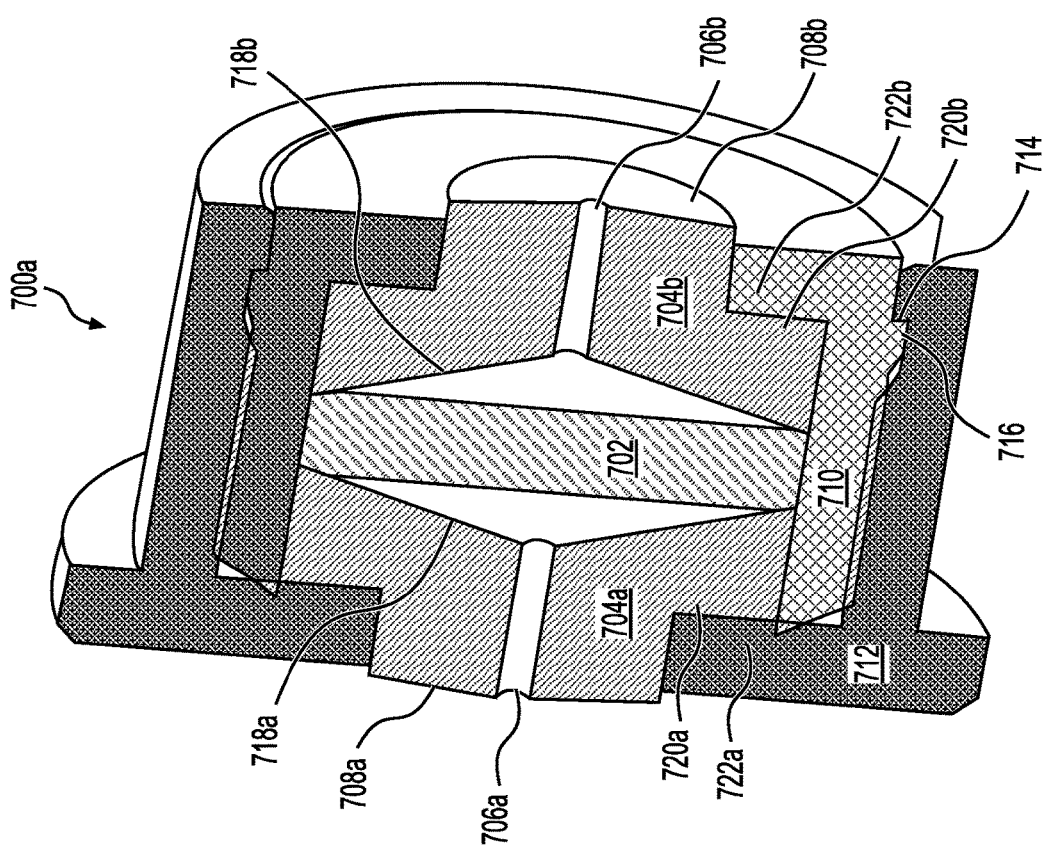
FIG. 7A is a perspective cross-section of a filter assembly, in accordance with an example of the present disclosure.
Figure 7B:
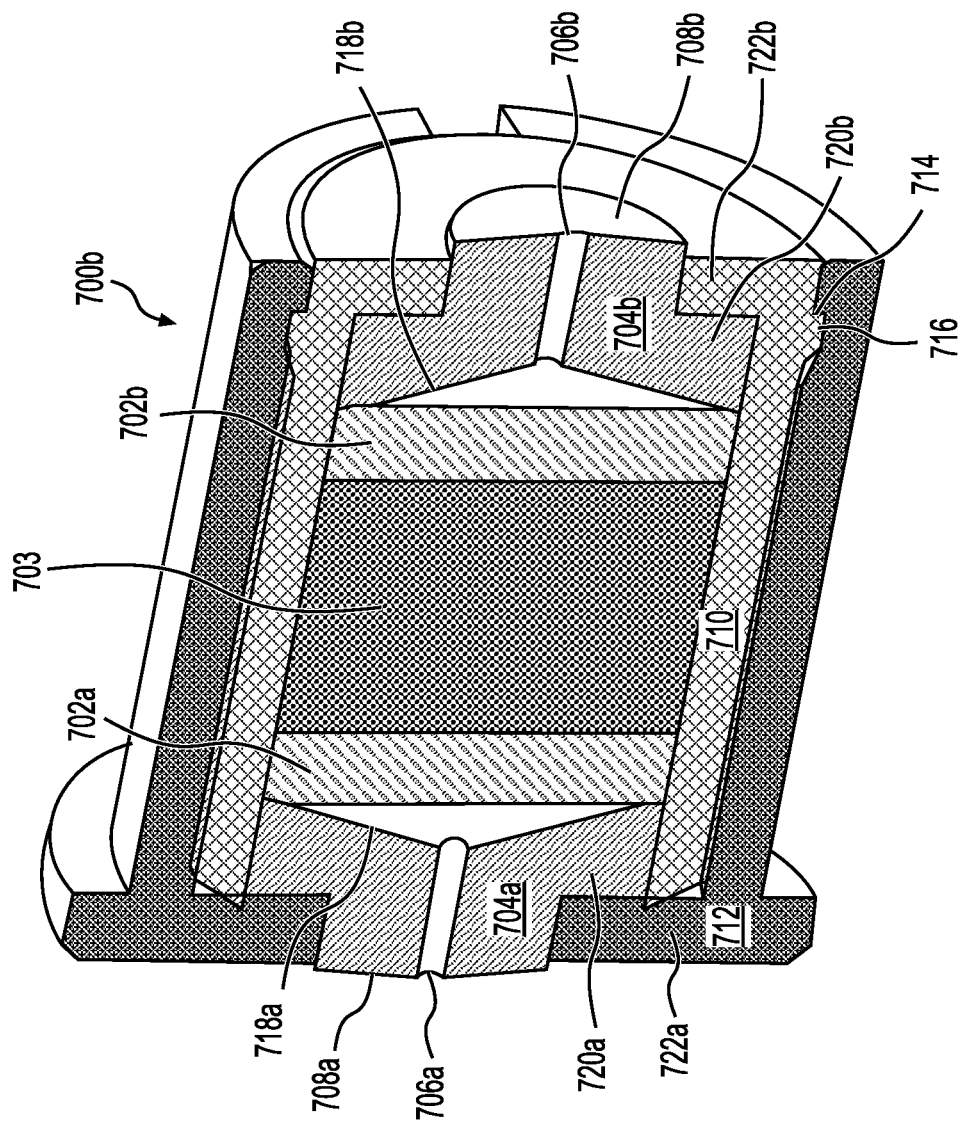
FIG. 7B is a perspective cross-section of a guard column assembly, in accordance with an example of the present disclosure.

Referring now to FIG. 7A, another example provides a filter assembly 700a. The filter assembly 700a advantageously remains fluid-tight when subject to elevated fluid pressure, e.g., greater than 50 bar (5,000 kPa), 350 bar (35,000 kPa), 1,000 bar (100,000 kPa), 1,300 bar (130,000 kPa), and the like without requiring significant pre-flow tightening of the system 100, e.g., over 7 pounds-force (about 58 N).

Filter 702 is held within the filter assembly 700a and may be of the type used in HPLC. For example, the filter 702 may be a sintered frit, such as 300 series sintered steel.

Figure 8:
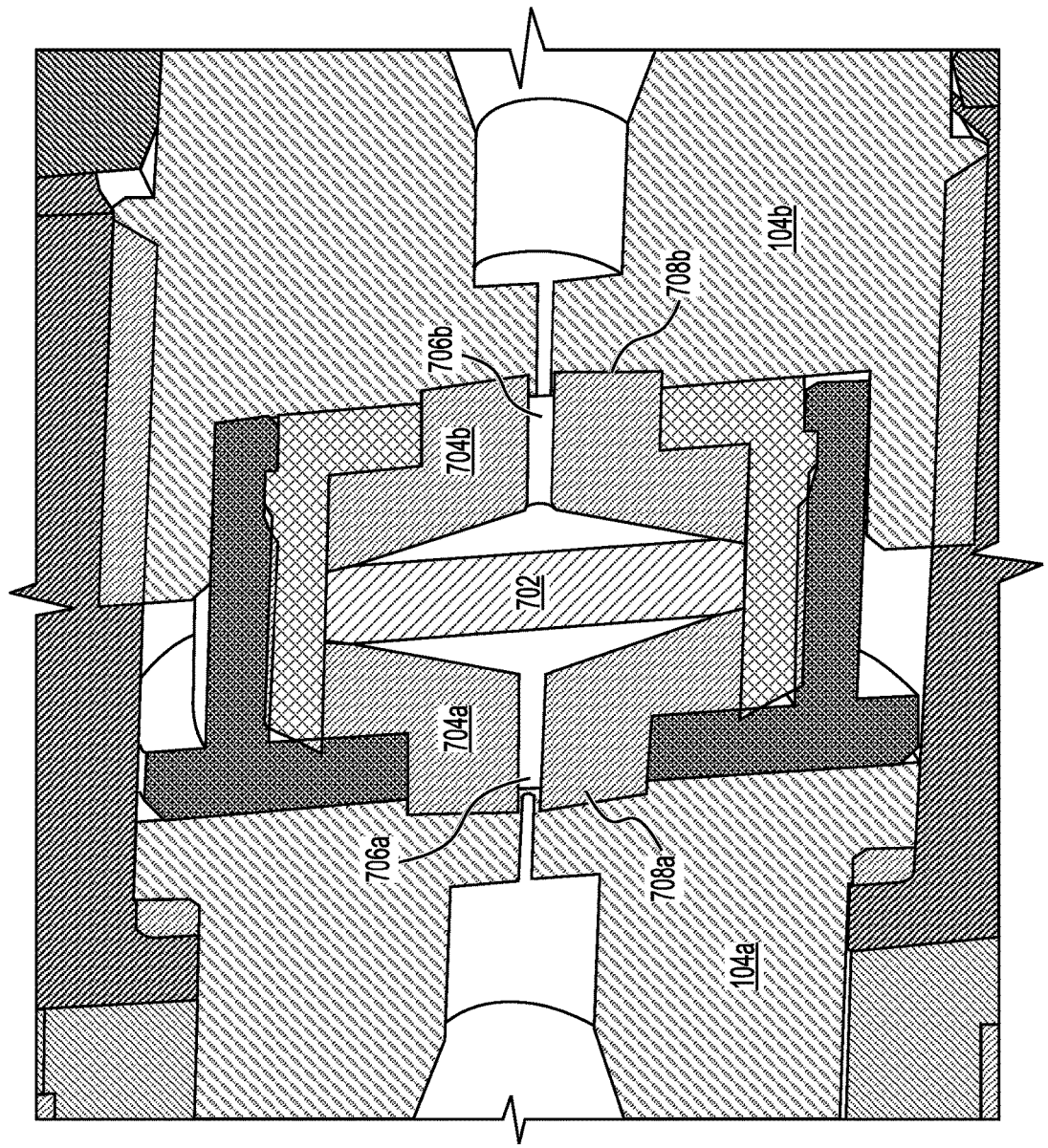
FIG. 8 is a perspective partial cross-section of a system including a filter assembly, in accordance with an example of the present disclosure.

Gaskets 704a, 704b may sit proximally and distally to the filter 702. The gaskets 704a, 704b define a first channel 706a and a second channel 706b for fluid inflow and outflow. The first and second channels 706a and 706b may be centered (e.g., axially) and/or surrounded by an exterior gasket face 708a, 708b to form a seal with fittings 104a and 104b as best seen in FIG. 8. In an example, each of the first and second channels 706a and 706b may include a diameter of from about 0.01 mm or less to about 0.9 mm, for example from about 0.1 mm to about 0.5 mm, such as a diameter of about 0.3 mm.

Filter 702 and gaskets 704a, 704b are held between a female housing 712 and a male housing 710. Female housing 712 and male housing 710 may be held together through a variety of techniques including an interference fit, a press fit, a friction fit, a shrink fit, threading, welding, ultrasonic welding, adhesives, fasteners, and the like. In some examples, the female housing 712 and male housing 710 are held together through one or more features such as a radial undercut 714 and corresponding boss or ridge 716. In some examples, the female housing 712 and male housing 710 are assembled using a press and sold as a unit to end users. In an example, the female housing 712 may be made of polymers, a metal, or a combination of metals. For example, the female housing may be made of steel such as 17-4 steel. Similarly, the male housing 710 may be made of a metal or a combination of metals. For example, the male housing may be made of steel, such as 300 series steel.

Gaskets 704a, 704b may include one or more geometric features adapted and configured to provide a fluid-tight seal under pressure. For example, the gaskets 704a, 704b may include a stop shoulder 720a, 720b complementary to a stop shoulder 722a, 722b surrounding a bore (e.g., an axial bore) on gaskets 704a, 704b.

Gaskets 704a, 704b may also include a beveled surface 718a, 718b adjacent to the filter 702. The beveled surface 718a, 718b may have a conical profile centered around first and second channels 706a, 706b. The bevel may be (with respect to a radial plane) from about 5° to about 20 and the like. In other examples, the angle relative to a central axis may be from about 70 degrees (e.g., 20° with respect to a radial plane) to about 89 degrees (e.g., 1° with respect to a radial plane).

During operation, fluid pressure on the beveled surfaces 718a, 718b may primarily generate axially sealing pressure against stop shoulders 722a, 722b and/or radial sealing pressure against male housing 710. Thus, the higher the fluid pressure, the higher sealing pressure and more fluid-tight the filter assembly 700a. Accordingly, finger tightening force of from about 3 lbf to about 13 lbf, such as about 5 lbf to about 8 lbf on the system 100 is sufficient to completely seal the filter assembly 700a without the need to use external forces to further tighten the system 100.

In another example, a guard column 700b may advantageously remain fluid-tight when subject to elevated fluid pressure, e.g., greater than 50 bar (5,000 kPa), 350 bar (35,000 kPa), 1,000 bar (100,000 kPa), 1,300 bar (130,000 kPa), and the like without requiring significant pre-flow tightening, e.g., over 13 pounds-force (about 57.8 N).

In this example, the guard column 700b may include a first filter 702a, a second filter 702b and a media 703 positioned between the first filter 702a and the second filter 702b. The first filter 702a, the second filter 702b and the media 703 may be of any type used in HPLC, including, but not limited to ultra high-performance liquid chromatography (UHPLC). For example, the filters 702a and/or 702b may be a sintered frit made of metals, polymers, or a combination thereof. In this example, the media 703 may be made of particles, such as, metals, metal oxides, polymers, carbon (e.g., spherical shaped activated carbon, or carbon on silica material), silica-based particles or generic versions thereof, activated charcoal, stationary phase, etc. In other examples, the media 703 may include other types of material that are optimized for the solvent cleanup, and other such uses. The media and/or particles disclosed herein may be used for any of the filters disclosed herein, and/or other types of columns, online solid phase extraction (SPE), etc. One or more of filters 702a, 702b, and/or the media 703 may also be made of monolith.

Gaskets 704a and 704b may sit proximally and distally to the filters 702a and 702b. The gaskets 704a and 704b define a first channel 706a and a second channel 706b for fluid inflow and outflow. Each of the first and second channels 706a and 706b may be centered (e.g., axially) and/or surrounded by an exterior gasket face 708a and 708b to form a seal with fittings 104a and 104b. In an example, each of the first and second channels 706a and 706b may include a diameter of from about 0.01 mm or less to about 0.9 mm, for example from about 0.1 mm to about 0.5 mm, such as a diameter of about 0.3 mm.

Each of the filters 702a, 702b, the media 703, and the gaskets 704a, 704b are held between a female housing 712 and a male housing 710. Female housing 712 and male housing 710 may be held together through a variety of techniques including an interference fit, a press fit, a friction fit, a shrink fit, threading, welding, ultrasonic welding, adhesives, fasteners, and the like. In some examples, the female housing 712 and male housing 710 are held together through one or more features such as a radial undercut 714 and corresponding boss or ridge 716. In some examples, the female housing 712 and male housing 710 may be assembled using a press and sold as a unit to end users.

Gaskets 704a and 704b may include one or more geometric features adapted and configured to provide a fluid-tight seal under pressure. For example, the gaskets 704a and 704b may include a stop shoulder 720a and 720b complementary to a stop shoulder 722a and 722b surrounding a bore (e.g., an axial bore) on gaskets 704a and 704b.

Gaskets 704a and 704b may also include beveled surfaces 718a and 718b adjacent to the filters 702a and 702b. The beveled surfaces 718a and 718b may have a conical profile centered around the first and second channels 706a and 706b. The bevel may be (with respect to a radial plane) from about 5° to about 20° and the like.

During operation, fluid pressure on the beveled surfaces 718a and 718b primarily generated axially sealing pressure against stop shoulders 722a and 722b and/or generates radial sealing pressure against male housing 710. Thus, the higher the fluid pressure, the higher sealing pressure and more fluid-tight the guard column 700b. Accordingly, finger tightening force of from about 3 lbf to about 13 lbf, such as about 5 lbf to about 8 lbf on the system 100 is sufficient to completely seal the filter assembly 700a without the need to use external forces to further tighten the system 100.

EXAMPLES

Figure 9:
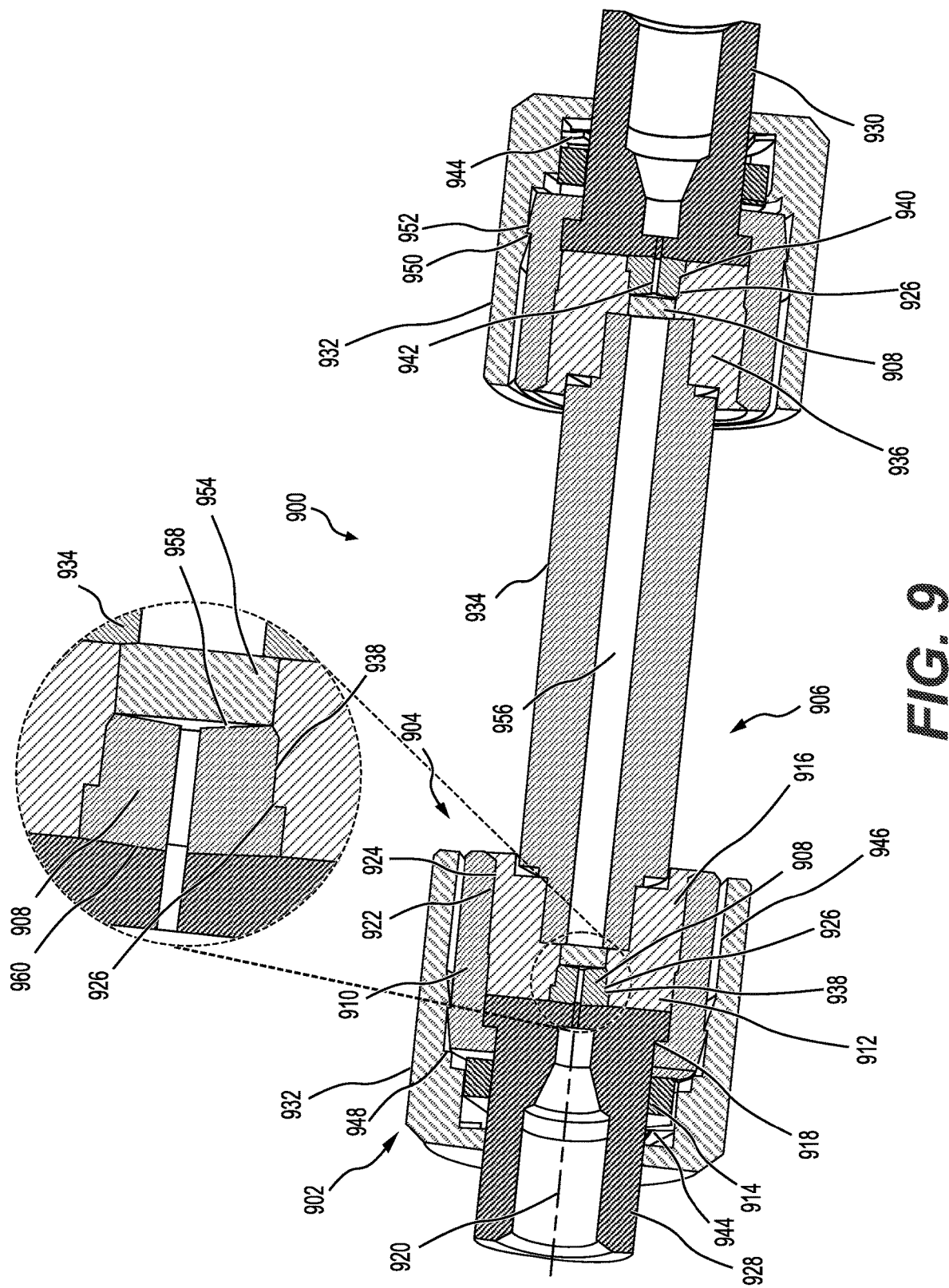
FIG. 9 is a perspective partial cross-section of a system including a torque-indicating fitting, components of which may constitute a filter assembly, in use with a relatively short length filter cartridge including a first type of gasket, in accordance with an example of the present disclosure.

An Open Face type filter element (prior art) and closed face inline filter design of the current invention (FIG. 7B) were tested for the preload needed to seal at given applied pressure. The pressure was generated by an Agilent 1290 Infinity II LC pump using isopropyl alcohol. A schematic of the test fixture is shown below (FIG. 9)

Procedure: The filter was inserted into the fixture, resting on the seal block. The compression ring was tightened to a reading of 5 lb. preload, pressing the filter between the seal block and the nut body. The test would start and if the set pressure (bar) was not achieved, the compression ring would further tighten, increasing the load. Once the pressure graph showed the desired pressure has been reached and once the flow graph showed the leak rate was no longer decreasing, the compression ring was no longer tightened, and the system was held at the set pressure. Each run was ~90 seconds in length. At the end of the test, the pressure returned to ambient. The current load reading (lbs.) and the resultant leak rate (uL/min) were recorded. The open and closed face configurations were tested with three filters each, at 200, 400, and 600 bar.

| Open Face Filter | | | |
|---|---|---|---|
| Filter | Pressure (bar) | Preload (lbs.) | Leak Rate (uL/min) |
| OF1 | 200 | 218 | 3.87 |
| | 400 | 229 | 7.587 |
| | 600 | 333 | 11.46 |
| OF2 | 200 | 204 | 3.73 |
| | 400 | 230 | 7.73 |
| | 600 | 391 | 65 |
| OF3 | 200 | 137 | 6.4 |
| | 400 | 157 | 7.2 |
| | 600 | 214 | 2.13 |

| Closed Face Filter | | | |
|---|---|---|---|
| Filter | Pressure (bar) | Preload (lbs.) | Leak Rate (uL/min) |
| CF1 | 200 | 5 | <0.1 |
| | 400 | 5 | <0.1 |
| | 600 | 7 | <0.1 |
| CF2 | 200 | 5 | <0.1 |
| | 400 | 5 | <0.1 |
| | 600 | 5 | 0.13 |
| CF3 | 200 | 5 | <0.1 |
| | 400 | 5 | <0.1 |
| | 600 | 5 | <0.1 |

All open face filters required a high preload to form a seal and resulted in comparably high leak rates. The closed face filter cartridges required a minimal preload (finger-tight) to achieve a leak-free seal.

Torque-Indicating Fitting

Figure 10:
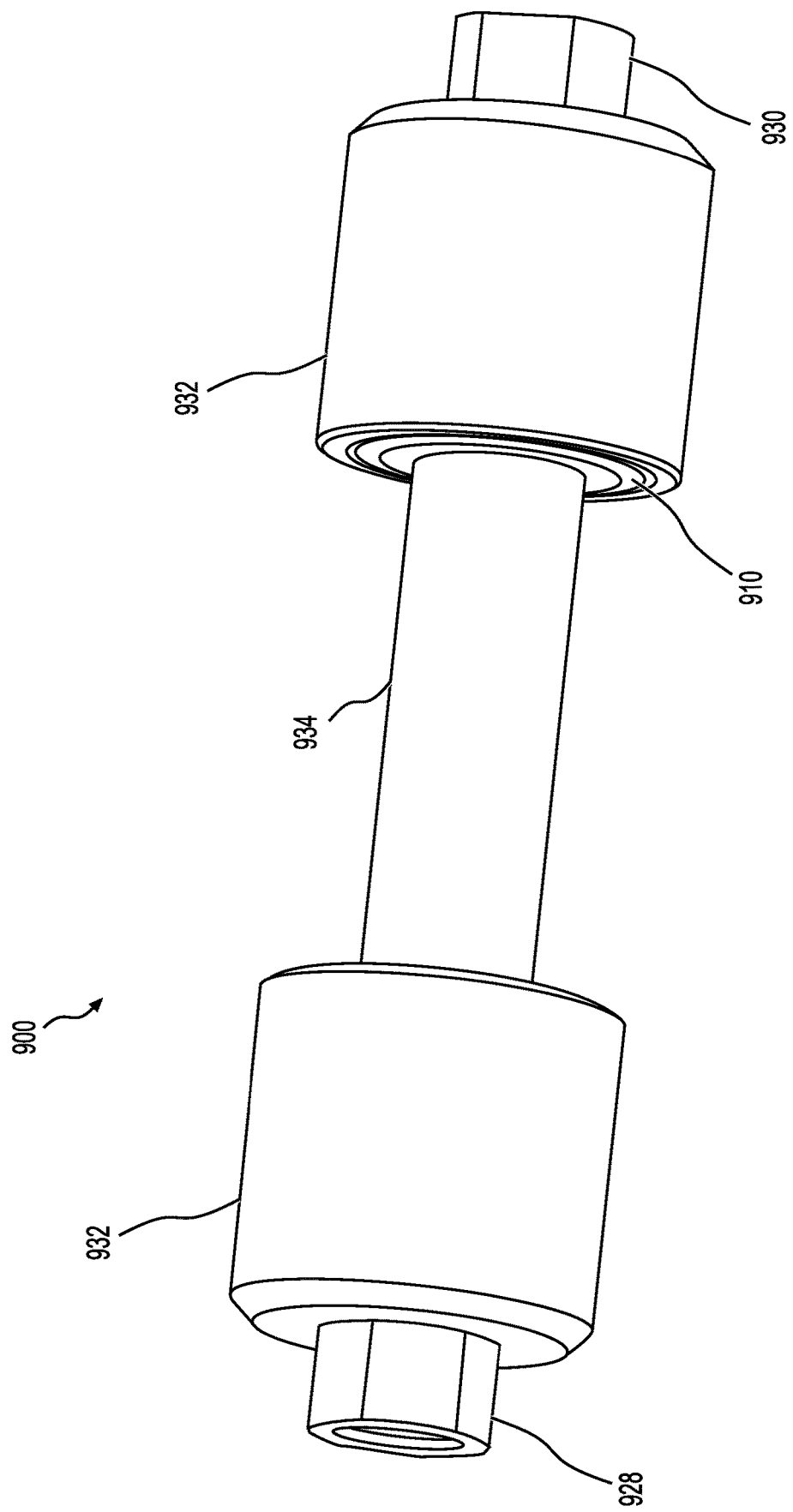
FIG. 10 is a perspective view of the system of FIG. 9, in use with the relatively short length filter cartridge, in accordance with an example of the present disclosure.
Figure 11:
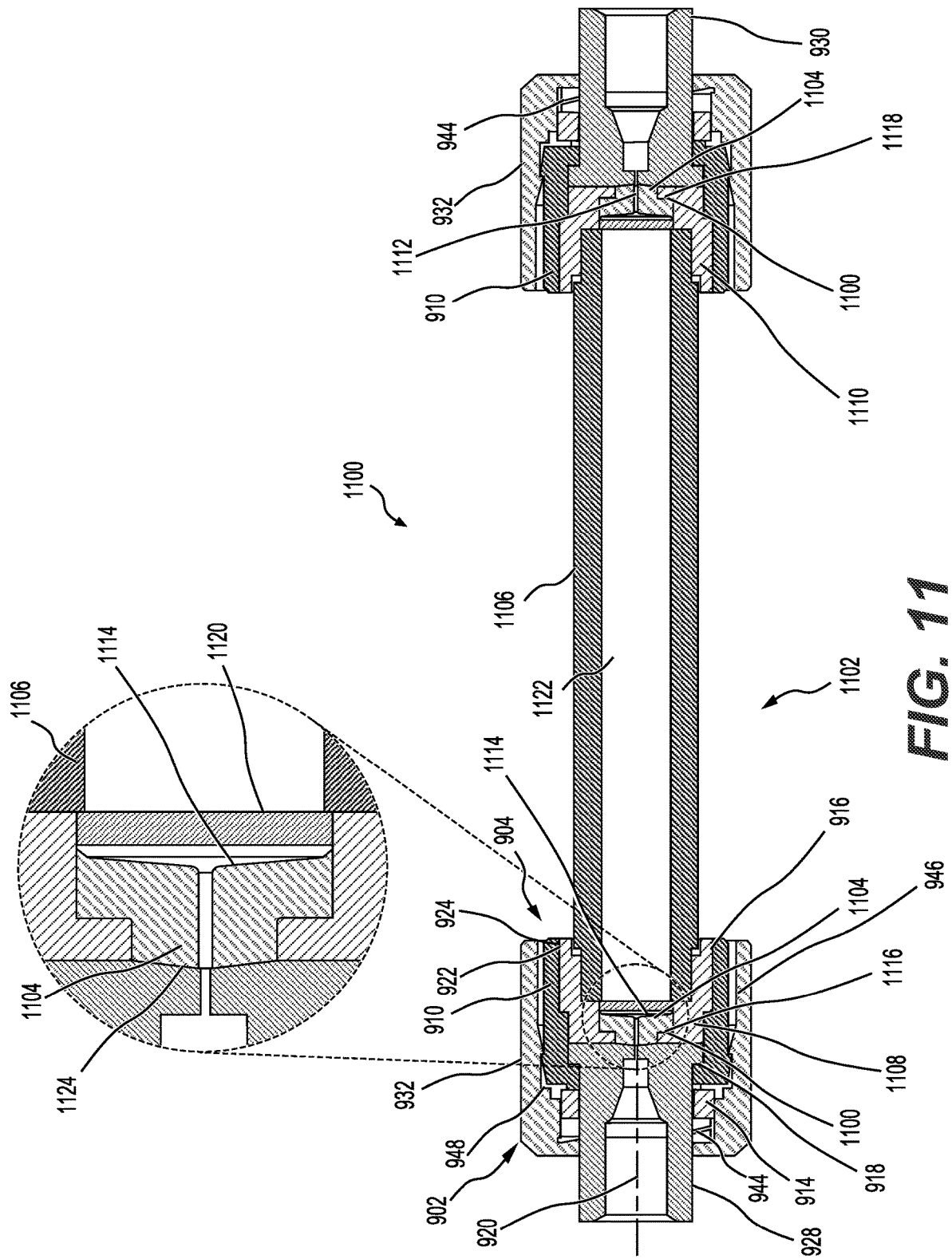
FIG. 11 is a perspective partial cross-section of the system including the torque-indicating fitting of FIG. 9, in use with a relatively long length filter cartridge including a second type of gasket, in accordance with an example of the present disclosure.
Figure 12:
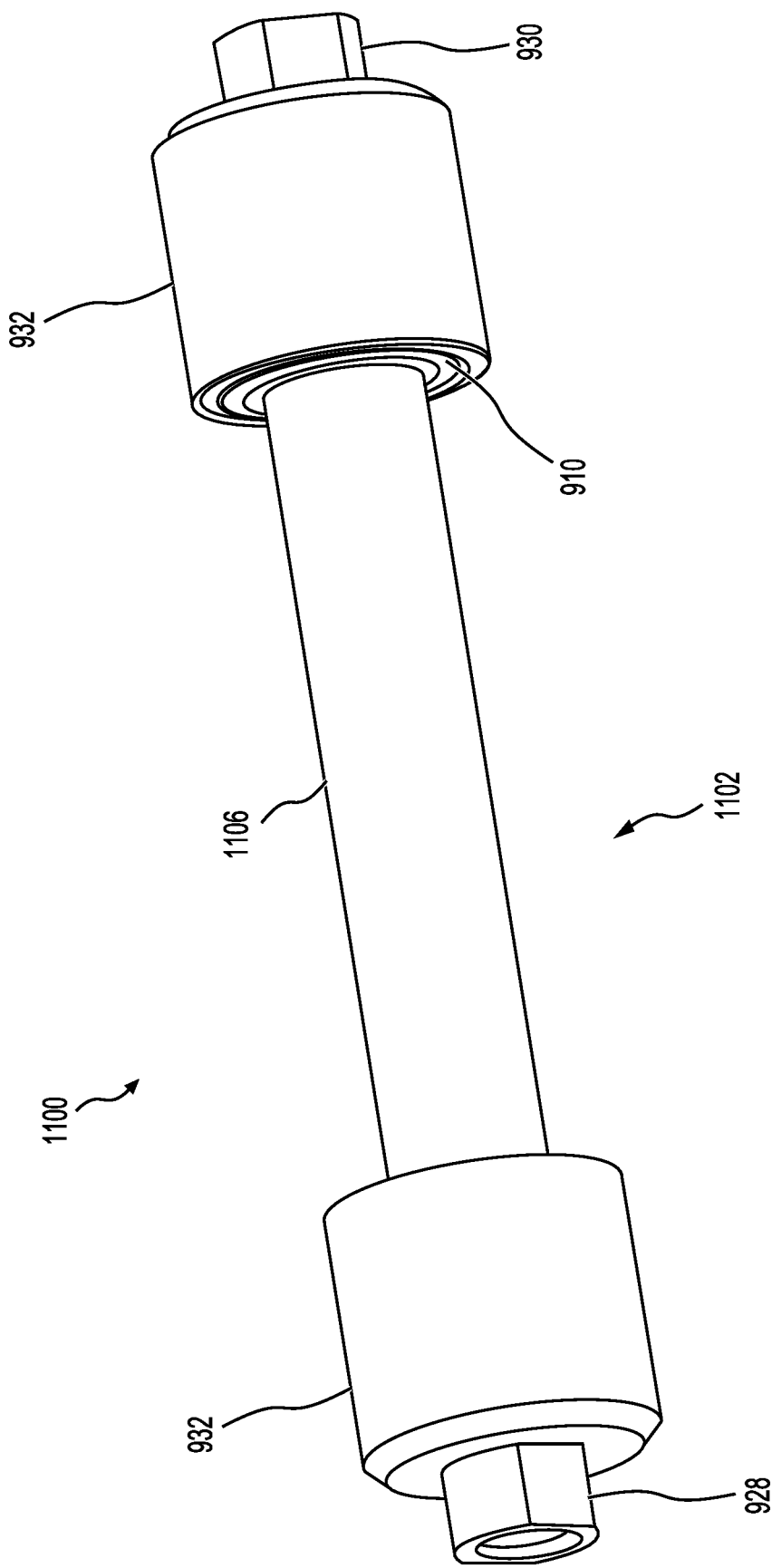
FIG. 12 is a perspective view of the system of FIG. 11, in use with the relatively long length filter cartridge, in accordance with an example of the present disclosure.

FIG. 9 is a perspective partial cross-section of a system 900 including a torque-indicating fitting 902, components of which may constitute a filter assembly 904, in use with a relatively short length filter cartridge 906 including a first type of gasket 908, in accordance with an example of the present disclosure. FIG. 10 is a perspective view of the system 900, in use with the relatively short length filter cartridge 906, in accordance with an example of the present disclosure. FIG. 11 is a perspective partial cross-section of a system 1100 including the torque-indicating fitting 902, in use with a relatively long length filter cartridge 1102 including a second type of gasket 1104, in accordance with an example of the present disclosure. FIG. 12 is a perspective view of the system 1100, in use with the relatively long length filter cartridge 1102, in accordance with an example of the present disclosure.

Referring to FIGS. 9 and 10, the filter assembly 904, which may include any two or more components of the torque-indicating fitting 902, may include a driven coupler 910 engageable with a filter fitting 912 of a filter cartridge 906. The filter assembly 904 may also include a torque-indicating driving collar 914 as disclosed herein. The driven coupler 910 may include a bore 916 to receive the filter fitting 912, and a stop shoulder 918 surrounding the bore 916 to limit movement of the driven coupler 910 relative to the filter fitting 912.

The stop shoulder 918 of the filter fitting 912 may be perpendicular to a central axis 920 of the filter assembly 904. The driven coupler 910, the filter fitting 912, and the filter cartridge 906 may be radially symmetric about the central axis 920 of the filter assembly 904.

Figure 15:
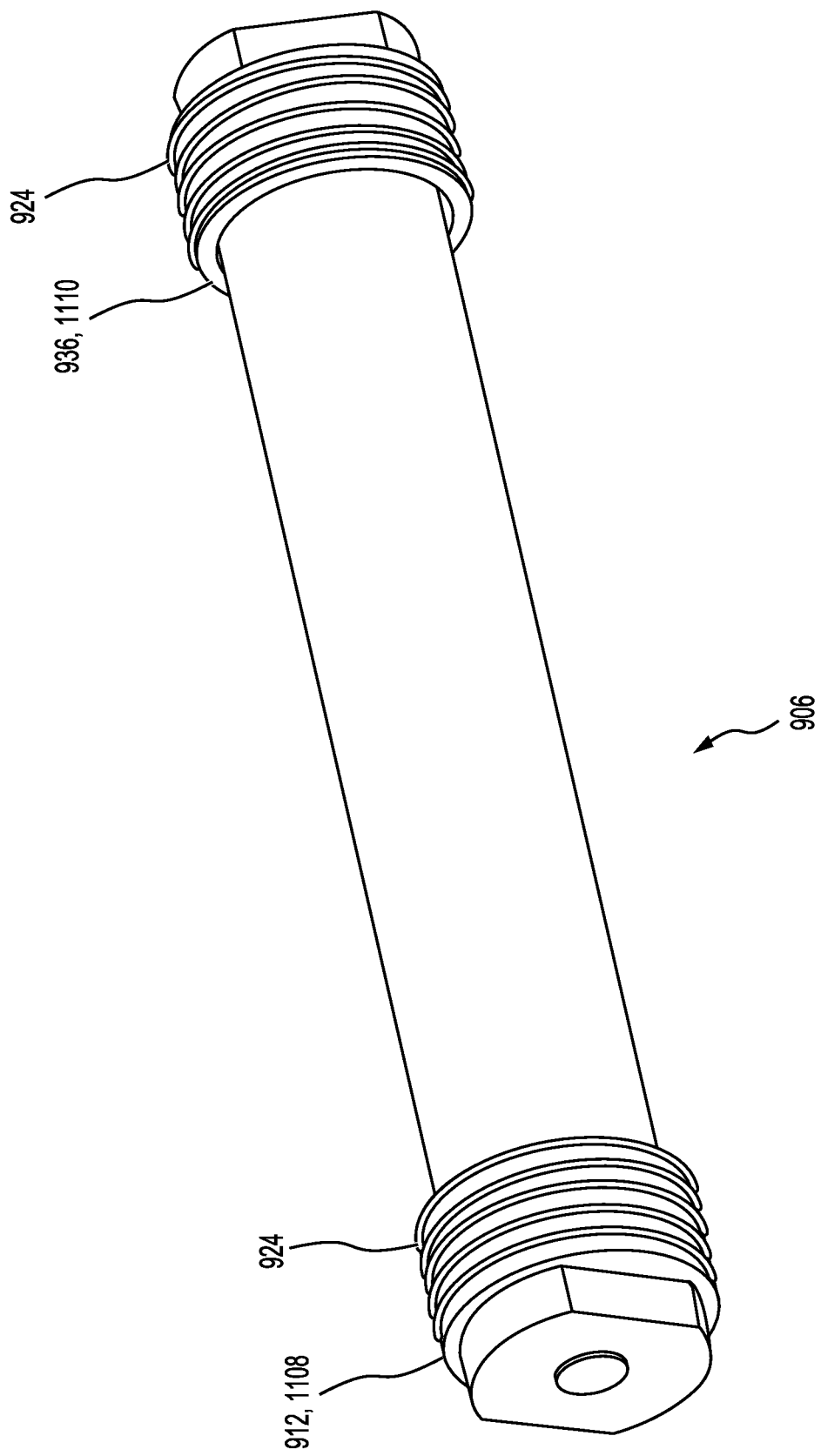
FIG. 15 is a perspective view of the filter cartridge of FIG. 9, with the thread details on the external surface of the filter fitting, in accordance with an example of the present disclosure.

The driven coupler 910 may include an internal thread 922 for threaded engagement with an external thread 924 of the filter fitting 912 (e.g., see also FIG. 15).

For the example of FIG. 9, the gasket 908 may include a complementary geometry 926 that reduces in diameter towards a central direction of the filter cartridge 906. For example, a diameter of the gasket 908 reduces from a larger diameter adjacent to a fitting 928, to a smaller diameter adjacent to frit 954. In this manner, the gasket 908 may form a seal against a corresponding filter fitting.

The torque-indicating fitting 902 and the relatively short length filter cartridge 906 may be fluidically coupled to fittings 928 and 930, which may be further coupled to other components of a liquid chromatography (LC) system, for example, by swaging and other techniques.

Figure 13:
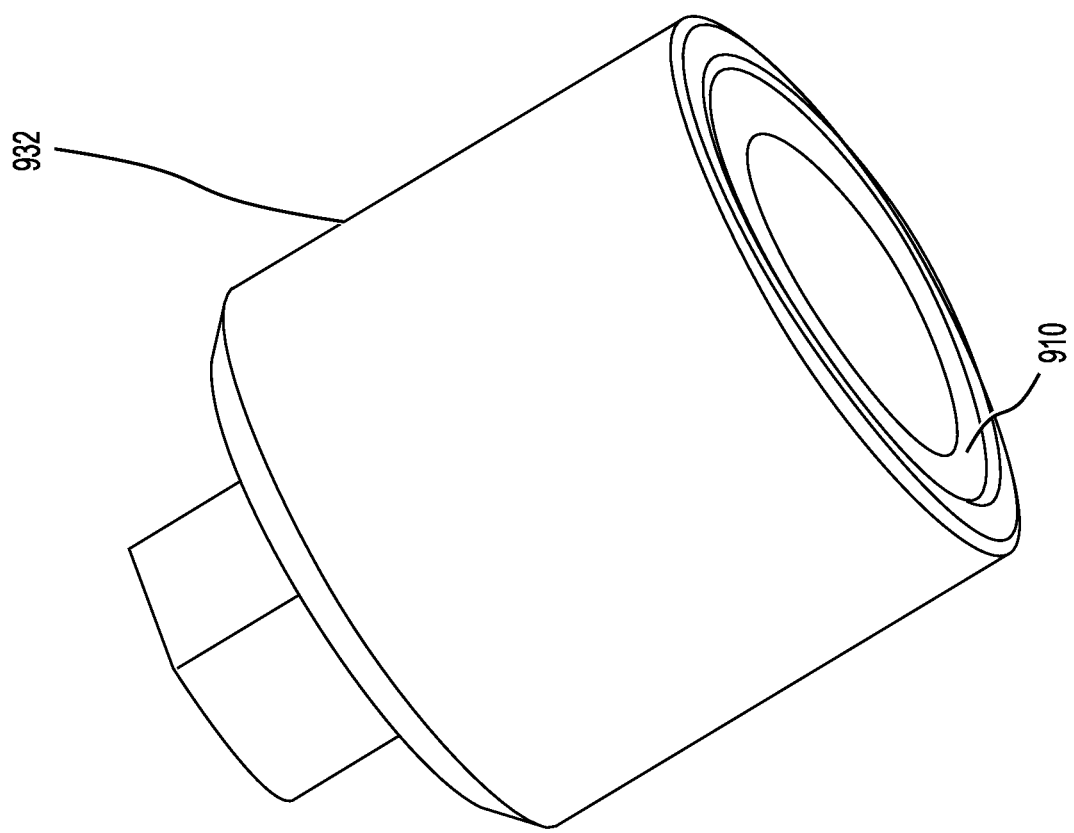
FIG. 13 is a perspective view of a thumbpiece of the system of FIG. 9, including a driven coupler in the thumbpiece, in accordance with an example of the present disclosure.

The filter assembly 904 may further include a thumbpiece 932 engageable with the driven coupler 910 to rotate the driven coupler 910. FIG. 13 is a perspective view of the thumbpiece 932 of the system 900 (and 1100), including the driven coupler 910 in the thumbpiece 932, in accordance with an example of the present disclosure.

As shown in FIG. 9, the torque-indicating fitting 902 may further include a resilient member 944 adjacent to the torque-indicating driving collar 914. The thumbpiece 932 may cover at least the torque-indicating driving collar 914 and the resilient member 944. The thumbpiece 932 may include a recess 946 accommodating the torque-indicating driving collar 914 and the resilient member 944, and at least one advancement-limiting feature 948 adapted and configured to limit axial movement of the thumbpiece 932. The at least one advancement-limiting feature 948 may include a stop shoulder.

The thumbpiece 932 and the driven coupler 910 may further include complementary features to hold the thumbpiece 932 and the driven coupler 910 together with the torque-indicating driving collar 914 and the resilient member 944 held between. The complementary features may include a thumbpiece protrusion 950 and a driven coupler protrusion 952.

Figure 16:
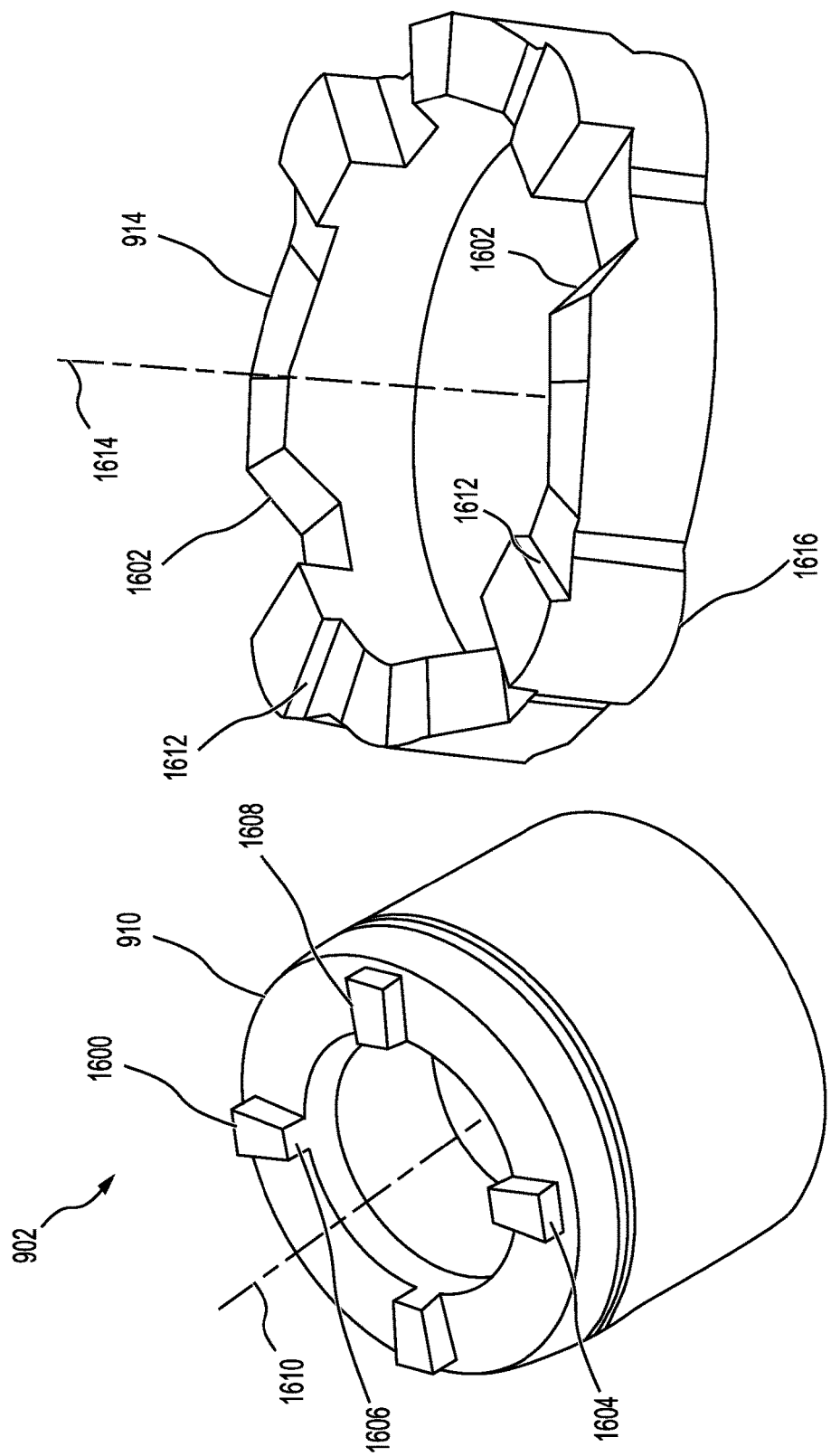
FIG. 16 is a perspective view of a driven coupler and a torque-indicating driving collar of the system of FIG. 9, in accordance with an example of the present disclosure.

Referring to FIGS. 9 and 16, the thumbpiece 932 may further include at least one axial thumbpiece-alignment feature (similar to thumbpiece-alignment features 128 of FIG. 4) complementary to at least one axial collar-alignment feature 1616 of the torque-indicating driving collar 914 (e.g., see FIG. 16). In the example of FIG. 16, the axial collar-alignment feature 1616 is shown as radially outer bosses or ridges, but may instead include radially inner grooves and the like.

In some examples, the thumbpiece 932 may include a knurled outer surface. The knurled outer surface may facilitate manual (e.g., by hand) rotation of the thumbpiece 932 to attach the torque-indicating fitting 902 onto the filter cartridge 906 (or 1102), or to detach the torque-indicating fitting 902 from the filter cartridge 906 (or 1102).

The filter assembly 904 advantageously remains fluid-tight when subject to elevated fluid pressure, e.g., greater than 50 bar (5,000 kPa), 350 bar (35,000 kPa), 1,000 bar (100,000 kPa), 1,300 bar (130,000 kPa), and the like without requiring significant pre-flow tightening of the system 900, e.g., over 7 pounds-force (about 58 N).

A sintered frit 954, such as 300 series sintered steel, may be disposed between the gasket 908 and the filter 934, on both sides of the filter 934, to prevent entry of specified (e.g., too large based on an application of the system 900) size particles into passage 956.

According to examples disclosed herein, the driven coupler 910 and the torque-indicating driving collar 914 may be made of polymers, a metal, or a combination of metals. For example, the driven coupler 910 and the torque-indicating driving collar 914 may be made of steel such as 17-4 steel. Further, the resilient member 944 may be a wave spring, or another type of resilient member.

Filter 934 may be of any type used in HPLC, including, but not limited to UHPLC. For example, the filter 934 may be formed of steel, or another material such as a biocompatible metal. In this example, media that may be included in passage 956 may be made of particles, such as, metals, metal oxides, polymers, carbon (e.g., spherical shaped activated carbon, or carbon on silica material), silica-based particles or generic versions thereof, activated charcoal, stationary phase, etc. In other examples, the media may include other types of material that are optimized for the solvent cleanup, and other such uses. The media and/or particles disclosed herein may be used for any of the filters disclosed herein, and/or other types of columns, online solid phase extraction (SPE), etc.

In some examples, the filter 934 of the relatively short length filter cartridge 906 may be about 30 mm long compared to the filter 1106 of the relatively long length filter cartridge 1102 may be about 50 mm long. In this regard, the passage 956 of the relatively short length filter cartridge 906 may include an about 2.1 mm in diameter compared to the passage 1122 of the relatively long length filter cartridge 1102, which may be about 4.6 mm in diameter. Both the filter 934 and the filter 1106 may be utilized for HPLC and UHPLC applications.

Figure 14:
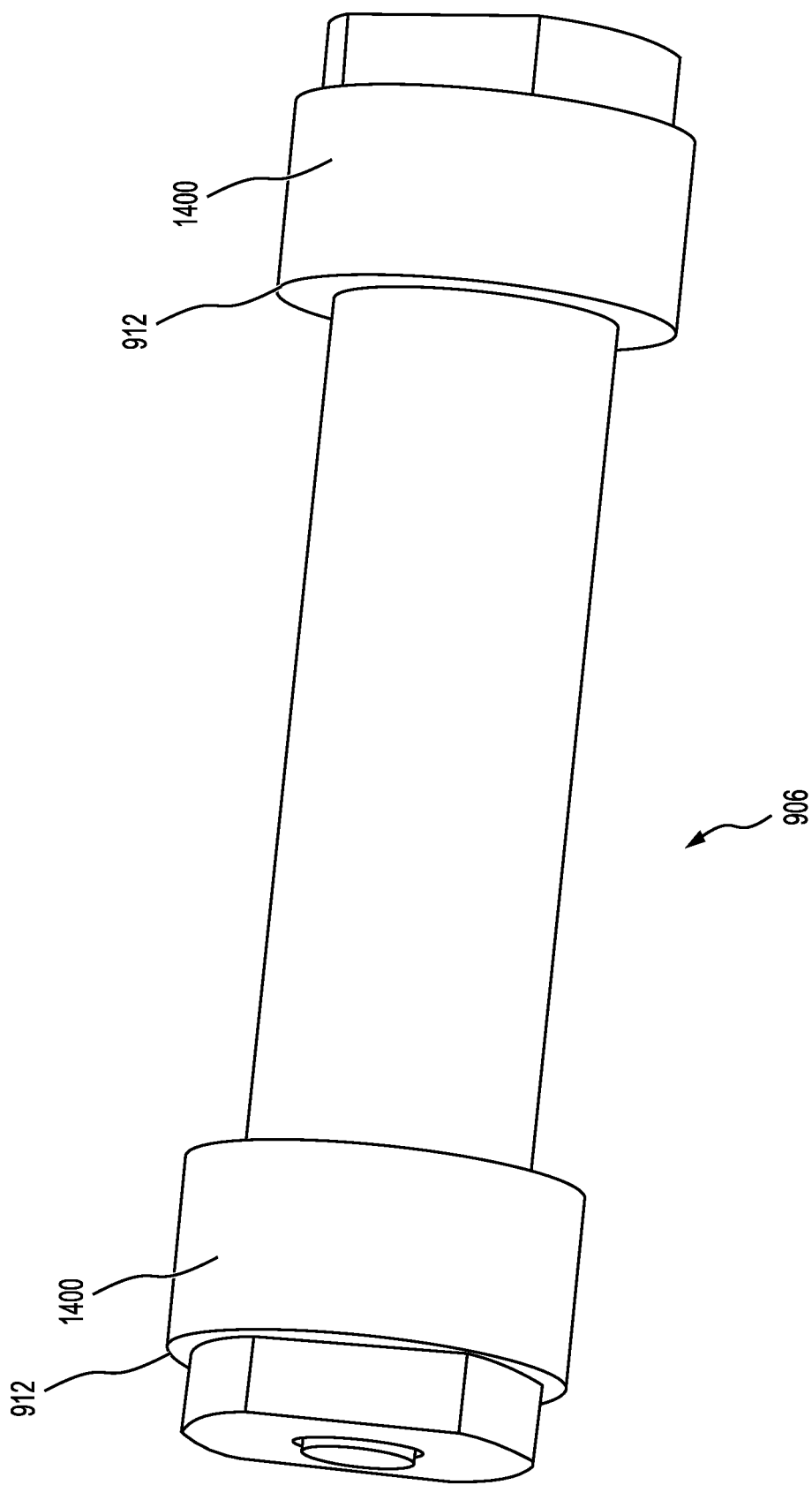
FIG. 14 is a perspective view of the filter cartridge of FIG. 9, without the thread details on an external surface of a filter fitting, in accordance with an example of the present disclosure.

FIG. 14 is a perspective view of the filter cartridge 906, without the thread details on an external surface 1400 of the filter fitting 912, in accordance with an example of the present disclosure. FIG. 15 is a perspective view of the filter cartridge 906, with thread details (e.g., external thread 924) on the external surface of the filter fitting 912, in accordance with an example of the present disclosure.

Referring to FIGS. 9, 14, and 15, the filter cartridge 906 may include the filter fitting 912 (e.g., a first filter fitting 912) on one side of a filter 934 (or filter 1106 of FIG. 11), and a second filter fitting 936 on a second opposite side of the filter 934 (or filter 1106 of FIG. 11). Referring to FIGS. 11, 14, and 15, the filter cartridge 1102 may include a first filter fitting 1108 on one side of a filter 1106 (or filter 934 of FIG. 9), and a second filter fitting 1110 on a second opposite side of the filter 1106 (or filter 934 of FIG. 9). As shown in FIGS. 9 and 11, the filter fittings 912 and 936 may include a different configuration compared to the filter fittings 1108 and 1110 to respectively accommodate gaskets 908 and 1104.

As shown in FIG. 9, the filter cartridge 906 may include gasket 908 (e.g., a first gasket) disposed in the filter fitting 912 (e.g., a first filter fitting), and a gasket 908 (e.g., a second gasket) disposed in the filter fitting 936 (e.g., a second filter fitting). As shown in FIG. 11, the filter cartridge 1102 may include gasket 1104 (e.g., a first gasket) disposed in the filter fitting 1108 (e.g., a first filter fitting), and a gasket 1104 (e.g., a second gasket) disposed in the filter fitting 1110 (e.g., a second filter fitting). The gaskets 908 and 1104 may include different configurations as shown in FIGS. 9 and 11.

As shown in FIG. 9, the gasket 908 (e.g., a first gasket on the left hand side and a second gasket on the right hand side in the orientation of FIG. 9) may include a complementary geometry 926 to respectively form a seal against area 938 of the first filter fitting 912 and area 940 of the second filter fitting 936.

For the example of FIG. 9, the first filter fitting 912, the second filter fitting 936, and the gasket 908 (e.g., a first gasket on the left hand side and a second gasket on the right hand side in the orientation of FIG. 9) may be radially symmetric about a central axis (which may be coincident with the central axis 920) of the filter cartridge 906.

The gasket 908 (e.g., a first gasket on the left hand side and a second gasket on the right hand side in the orientation of FIG. 9) may include a central axial channel 942. In an example, the channel 942 may include a diameter of from about 0.01 mm or less to about 0.9 mm, for example from about 0.1 mm to about 0.5 mm, such as a diameter of about 0.3 mm.

The gasket 908 may include a beveled surface 958 adjacent to the filter 934 (with frit 954 disposed therebetween). The beveled surface 958 may include an angle relative to a central axis (which may be coincident with the central axis 920) of the filter cartridge from about 70 degrees to about 89 degrees.

The gasket 908 may further include a protruding surface 960, which may include an angle relative to a plane that is perpendicular to a central axis (which may be coincident with the central axis 920) of the filter cartridge from about 85 degrees to about 89 degrees, such as about 87 degrees.

During operation, fluid pressure on the beveled surface 958 may primarily generate axially sealing pressure against frit 954 and/or radial sealing pressure against the filter fitting. Thus, the higher the fluid pressure, the higher sealing pressure and more fluid-tight the filter assembly 904. Accordingly, finger tightening force of from about 3 lbf to about 13 lbf, such as about 5 lbf to about 8 lbf on the system 900 is sufficient to completely seal the filter assembly 904 without the need to use external forces to further tighten the system 900.

As shown in FIG. 11, the gasket 1104 (e.g., a first gasket on the left hand side and a second gasket on the right hand side in the orientation of FIG. 11) may include a complementary geometry to respectively form a seal against a stop shoulder 1116 of the first filter fitting 1108 and a stop shoulder 1118 of the second filter fitting 1110. The stop shoulder 1116 of the first filter fitting 1108 and the stop shoulder 1118 of the second filter fitting 1110 may be perpendicular to a central axis (which may be coincident with the central axis 920) of the filter cartridge 1102.

For the example of FIG. 11, the first filter fitting 1108, the second filter fitting 1110, and the gasket 1104 (e.g., a first gasket on the left hand side and a second gasket on the right hand side in the orientation of FIG. 11) may be radially symmetric about a central axis (which may be coincident with the central axis 920) of the filter cartridge 1102. The gasket 1104 (e.g., a first gasket on the left hand side and a second gasket on the right hand side in the orientation of FIG. 11) may include a central axial channel 1112. In an example, the channel 1112 may include a diameter of from about 0.01 mm or less to about 0.9 mm, for example from about 0.1 mm to about 0.5 mm, such as a diameter of about 0.3 mm The gasket 1104 may include a beveled surface 1114 adjacent to the filter 1106. The beveled surface 1114 may include an angle relative to a central axis (which may be coincident with the central axis 920) of the filter cartridge from about 70 degrees to about 89 degrees.

The gasket 1104 may further include a protruding surface 1124, which may include an angle relative to a plane that is perpendicular to a central axis (which may be coincident with the central axis 920) of the filter cartridge from about 85 degrees to about 89 degrees, such as about 87 degrees.

During operation, fluid pressure on the beveled surface 1114 may primarily generate axially sealing pressure against frit 1120 and/or radial sealing pressure against the filter fitting. Thus, the higher the fluid pressure, the higher sealing pressure and more fluid-tight the filter assembly 904. Accordingly, finger tightening force of from about 3 lbf to about 13 lbf, such as about 5 lbf to about 8 lbf on the system 1100 is sufficient to completely seal the filter assembly 904 without the need to use external forces to further tighten the system 1100.

Referring to FIGS. 9 and 15, the filter fittings 912, 936, 1108, and 1110 may include external threads (e.g., the external thread 924). In this regard, the driven coupler 910 may include the internal thread 922 for threaded engagement with the external thread 924 of the filter fittings 912, 936, 1108, and 1110.

The sintered frit 1120, which may be 300 series sintered steel, may be disposed between the gasket 1104 and the filter 1106, on both sides of the filter 1106, to prevent entry of specified size particles into passage 1122.

Filter 1106 may be of any type used in HPLC, including, but not limited to UHPLC. For example, the filter 1106 may be formed of steel, or another material such as a biocompatible metal. In this example, media that may be included in passage 1122 may be made of particles, such as, metals, metal oxides, polymers, carbon (e.g., spherical shaped activated carbon, or carbon on silica material), silica-based particles or generic versions thereof, activated charcoal, stationary phase, etc. In other examples, the media may include other types of material that are optimized for the solvent cleanup, and other such uses. The media and/or particles disclosed herein may be used for any of the filters disclosed herein, and/or other types of columns, online solid phase extraction (SPE), etc.

Figure 17:
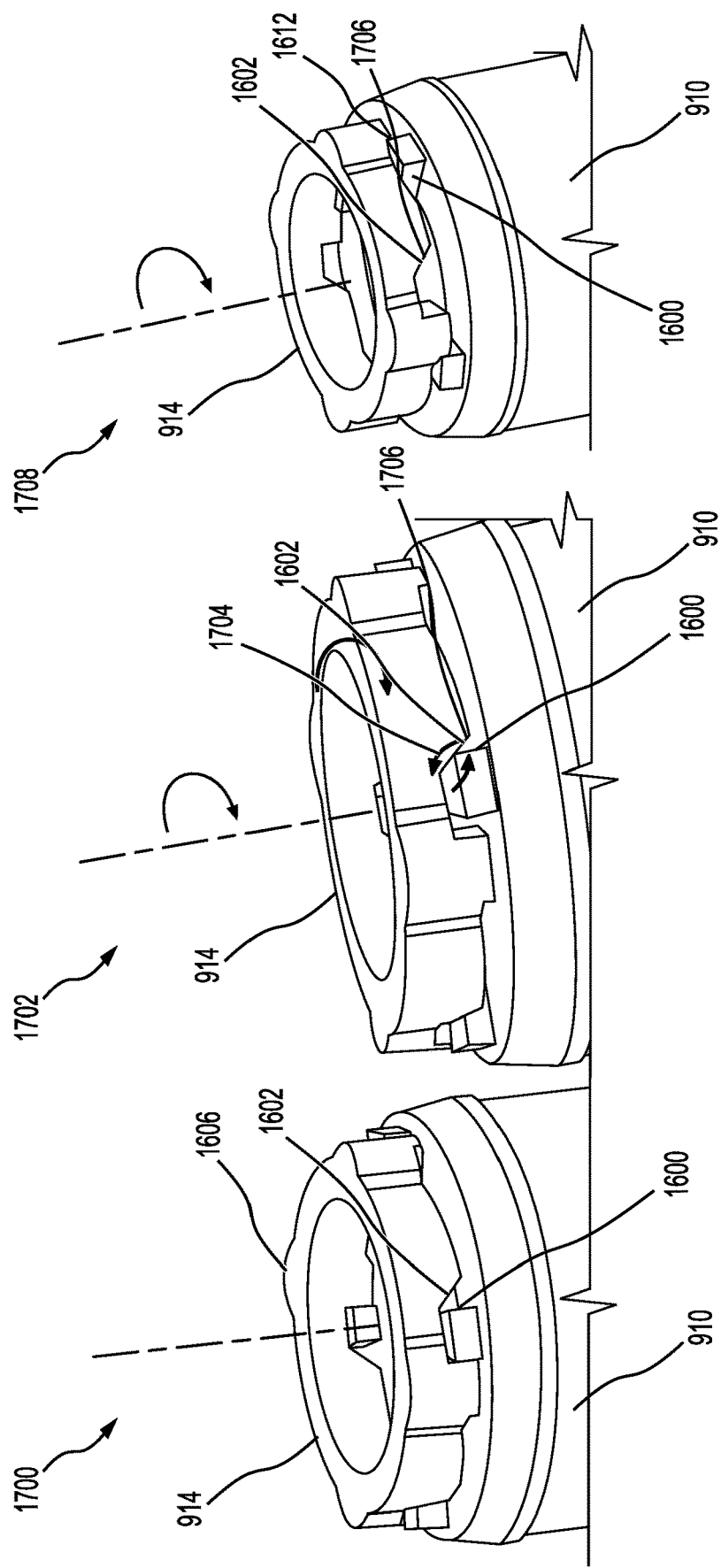
FIG. 17 is a perspective view illustrating operation of the driven coupler and the torque-indicating driving collar of FIG. 16, in accordance with an example of the present disclosure.

FIG. 16 is a perspective view of a driven coupler 910 and a torque-indicating driving collar 914 of the system 900 of FIG. 9, in accordance with an example of the present disclosure. FIG. 17 is a perspective view illustrating operation of the driven coupler 910 and the torque-indicating driving collar 914 of FIG. 16, in accordance with an example of the present disclosure.

Referring to FIGS. 9, 16, and 17, the torque-indicating fitting 902 may include the driven coupler 910 including at least one driven tooth 1600, and the torque-indicating driving collar 914 including at least one driving tooth 1602 positioned to engage with the at least one driven tooth 1600 as the torque-indicating driving collar 914 is rotated. Each driven tooth 1600 may include a trapezoidal configuration, where an outer face 1604 of the driven tooth 1600 includes a larger surface area compared to an inner face 1606. In this regard, a line along the edges 1608 (which may be sharp or rounded) may terminate at a central point along a central longitudinal axis 1610 of the driven coupler 910. Further, the at least one driven tooth 1600 may be located on a proximal end or on a radially outer surface of the driven coupler 910. Examples of slopes for the driving tooth 1602 (relative to a radial plane) may include less than about 90°, such as about 45°, from about 45° to about 15°, from about 30° to about 15°, about 22.5°, and the like.

The torque-indicating driving collar 914 may further include at least one torque-indicating tooth 1612 positioned adjacent to the at least one driving tooth 1602 to engage with the at least one driven tooth 1600 as the torque-indicating driving collar 914 is rotated. Lines along edges (which may be sharp or rounded) of the driving tooth 1602 and the torque-indicating tooth 1612 may similarly terminate at a central point along a central longitudinal axis 1614 of the torque-indicating driving collar 914.

The torque-indicating driving collar 914 may further include at least one axial collar-alignment feature 1616. The at least one axial collar-alignment feature 1616 may be located radially outer from or inner to the at least one driving tooth 1602.

The properties of the various components of the torque-indicating fitting 902 may be configured to allow the driving tooth 1602 to frictionally engage with and drive the driven tooth 1600 until a defined amount of torque is applied (e.g., driven coupler 910 forms a threaded seal with the corresponding filter fittings).

Operation of the system 900 is described with respect to FIGS. 9, 11, and 17.

Referring to FIGS. 9, 11, and 17, at 1700, the thumbpiece 932 (not shown in FIG. 17) may be used to rotate the torque-indicating driving collar 914, which may impart rotation on the driven coupler 910 based on contact of the driving tooth 1602 with the driven tooth 1600.

The torque applied to the driven coupler 910 when a user rotates the thumbpiece 932 may be controlled, for example, to prevent damage to components and facilitate later removal of the torque-indicating fitting 902 from a filter cartridge. In an example, the force applied to the driven coupler 910 may be from about 1 Pounds-force (lbf) or less to about 32 lbf, for example, the force may be from about 2 lbf to about 24 lbf, from about 3 lbf to about 13 lbf, such as about 5 lbf.

At 1702, as the torque exerted on the driven tooth 1600 reaches a maximum specified torque that is equal to a counter-acting force exerted by the resilient member 944 (e.g., as the resilient member 944 is compressed), as shown at 1704, the torque-indicating driving collar 914 may move away from the driven coupler 910 due to the angled contact between angled surface 1706 of the driving tooth 1602 with the driven tooth 1600.

At 1708, as the torque-indicating driving collar 914 continues to be rotated and as the angled surface 1706 of the driving tooth 1602 no longer contacts the driven tooth 1600, the torque-indicating driving collar 914 may freely rotate until contact of the driven tooth 1600 with the torque-indicating tooth 1612. In this regard, the contact of the driven tooth 1600 with the torque-indicating tooth 1612 may generate an audible and physical "click" that may be heard and felt through the thumbpiece 932 to indicate to a user that the torque-indicating fitting 902 is properly mounted to the filter cartridge 906 (or 1102) to avoid any unintended leakage associated with the system 900. At this point, once the torque-indicating fittings are properly installed on both sides of the filter cartridge 906 (or 1102), a user may utilize the system 900 as needed.

Examples of Materials

The various components described herein may be fabricated from a variety of materials including metal and polymers. The materials may be engineered to achieve desired levels of strength, resilience, and the like.

In some examples, driven couplers 208 and/or 910 and driving collars 220 and/or 914 are both fabricated from metals such as steel alloys such as stainless steel. The surfaces of teeth 212, 222, 1600, 1602, and/or 1612 may be engineered (e.g., through machining or surface treatments) to have a defined degree of smoothness or roughness, which will influence the torque at which the teeth 212, 222, 1600, 1602, and/or 1612 slip and/or maintain contact.

In some examples, gaskets 704a, 704b, 908, and/or 1104 may be fabricated from a polymer, a plastic, an elastomer, rubber, silicone, nitrile, rubber, polytetrafluoroethylene (PTFE, available under the TEFLON® mark), polychlorotrifluoroethylene, polyether ether ketone (PEEK), metals, and the like.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A filter assembly comprising:
a filter;
a first gasket adjacent to a first side of the filter;
a second gasket adjacent to a second side of the filter, wherein at least one of the first gasket or the second gasket includes a conically shaped beveled surface adjacent to the filter, wherein the conically shaped beveled surface includes a conical profile extending from first and second channels respectively of the first and second gaskets, wherein the conically shaped beveled surface is configured to provide a gap between at least one of the first gasket or the second gasket and the filter when at least one of the first gasket or the second gasket is disposed in an assembled configuration relative to the filter, and wherein an outermost diameter of at least one of the first gasket or the second gasket is substantially the same as an outermost diameter of the filter;
a female housing; and
a male housing;
wherein:
the male housing is sized to fit concentrically within the female housing;
each of the male housing and female housing include:
a bore; and
a stop shoulder surrounding the bore; and
each of the first gasket and second gasket include a complementary geometry to form a seal against a respective stop shoulder.

2. The filter assembly of claim 1, wherein the bores define a central axis.

3. The filter assembly of claim 2, wherein the stop shoulders are perpendicular to the central axis.

4. The filter assembly of claim 2, wherein the filter, the first gasket, the second gasket, the female housing, and the male housing are radially symmetric about the central axis.

5. The filter assembly of claim 1, wherein the first gasket and the second gasket each include a central axial bore.

6. The filter assembly of claim 1, wherein the beveled surface has an angle relative to a central axis of from about 70 degrees to about 89 degrees.

7. The filter assembly of claim 1, wherein fluid flow pressure about the filter produces increased sealing pressure between the complementary geometry of the first and second gaskets and respective stop shoulder of the female and male housings relative to a pre-flow state.

8. The filter assembly of claim 1, wherein the filter assembly is fluid-tight at fluid-flow pressures of 1,300 bar (130,000 kPa) without requiring a pre-flow sealing pressure above 13 pounds-force (57.8 N).

9. The filter assembly of claim 1, wherein the male housing and the female housing are press-fit together or are threaded together.

10. The filter assembly of claim 1, wherein the filter includes a first filter, a second filter, and a media between the first filter and the second filter.

11. The filter assembly of claim 1, further comprising:
a color depth indicator positioned external to the male housing or the female housing.

12. A filter assembly comprising:
a filter;
a first gasket having a first channel adjacent to a first side of the filter; and
a second gasket having a second channel adjacent to a second side of the filter, wherein the first gasket and the second gasket include conically shaped beveled surfaces adjacent to the filter, wherein the conically shaped beveled surfaces are configured to provide gaps between the first gasket and the second gasket and the filter when the first gasket and the second gasket are disposed in an assembled configuration relative to the filter, and wherein outermost diameters of the first gasket and the second gasket are substantially the same as an outermost diameter of the filter, and wherein the first channel and the second channel include a diameter of from about 0.01 mm to about 0.5 mm.

13. The filter assembly of claim 12, further comprising:
a male housing;
a female housing; and
a color depth indicator positioned external to the male housing or the female housing.

14. A guard column assembly comprising:
a first filter;
a second filter;
a media positioned between the first filter and the second filter;
a first gasket having a first channel adjacent to the first filter; and
a second gasket having a second channel adjacent to the second filter, wherein the first gasket and the second gasket include conically shaped beveled surfaces adjacent to the first filter and the second filter, respectively, wherein the conically shaped beveled surfaces are configured to provide gaps between the first gasket and the filter, and the second gasket and the second filter when the first gasket and the second gasket are disposed in an assembled configuration relative to the first filter and the second filter, and wherein outermost diameters of the first gasket and the second gasket are substantially the same as outermost diameters of the first filter and the second filter, respectively, and wherein the first channel and the second channel include a diameter of from about 0.01 mm to about 0.5 mm.

* * * * *